United States Patent
Conradi et al.

(10) Patent No.: US 7,990,622 B2
(45) Date of Patent: *Aug. 2, 2011

(54) PROJECTION OBJECTIVE OF A MICROLITHOGRAPHIC PROJECTION EXPOSURE APPARATUS

(75) Inventors: Olaf Conradi, Westhausen/Westerhofen (DE); Boris Bittner, Roth (DE); Sascha Bleidistel, Aalen (DE); Markus Hauf, Ichenhausen (DE); Wolfgang Hummel, Aalen (DE); Arif Kazi, Aalen (DE); Baerbel Schwaer, Aalen (DE); Jochen Weber, Heidenheim (DE); Hubert Holderer, Oberkochen (DE); Payam Tayebati, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/896,128

(22) Filed: Oct. 1, 2010

(65) Prior Publication Data

US 2011/0019169 A1 Jan. 27, 2011

Related U.S. Application Data

(63) Continuation of application No. 11/971,328, filed on Jan. 9, 2008, now Pat. No. 7,830,611.

(51) Int. Cl.
*G02B 1/06* (2006.01)
*G02B 3/12* (2006.01)
*G02B 27/02* (2006.01)

(52) U.S. Cl. ........ 359/665; 359/666; 359/667; 359/648; 359/649; 359/650; 359/651; 359/708; 359/798; 359/799; 359/800

(58) Field of Classification Search .......... 359/665–667, 359/648–651, 708–717, 798–800
See application file for complete search history.

(56) References Cited

U.S. PATENT DOCUMENTS

| | | | |
|---|---|---|---|
| 4,289,379 A | 9/1981 | Michelet | |
| 4,825,247 A | 4/1989 | Kemi et al. | |
| 4,890,903 A | 1/1990 | Treisman et al. | |
| 4,913,536 A | 4/1990 | Barnea | |
| 4,965,630 A | 10/1990 | Kato et al. | |
| 5,229,872 A | 7/1993 | Mumola | |
| 5,296,891 A | 3/1994 | Vogt et al. | |
| 5,523,193 A | 6/1996 | Nelson | |

(Continued)

FOREIGN PATENT DOCUMENTS

DE 198 27 603 12/1999

(Continued)

OTHER PUBLICATIONS

K.R. Wolf, "Phosphoric Acid as a High-Index Immersion Fluid," $22^{nd}$ Annual Microelectronic Engineering Conference, May 2004, pp. 40-43.

(Continued)

*Primary Examiner* — Evelyn A. Lester
(74) *Attorney, Agent, or Firm* — Fish & Richardson P.C.

(57) ABSTRACT

A projection objective of a microlithographic projection exposure apparatus comprises a manipulator for reducing rotationally asymmetric image errors. The manipulator in turn contains a lens, an optical element and an interspace formed between the lens and the optical element, which can be filled with a liquid. At least one actuator acting exclusively on the lens is furthermore provided, which can generate a rotationally asymmetric deformation of the lens.

47 Claims, 10 Drawing Sheets

U.S. PATENT DOCUMENTS

| | | |
|---|---|---|
| 5,665,275 A | 9/1997 | Kobayashi et al. |
| 5,684,637 A | 11/1997 | Floyd |
| 5,731,909 A | 3/1998 | Schachar |
| 5,805,273 A | 9/1998 | Unno |
| 6,038,080 A | 3/2000 | Schachar |
| 6,104,472 A | 8/2000 | Suzuki |
| 6,388,823 B1 | 5/2002 | Gaber et al. |
| 6,583,850 B2 | 6/2003 | Hummel et al. |
| 6,930,838 B2 | 8/2005 | Schachar |
| 7,830,611 B2 * | 11/2010 | Conradi et al. ............... 359/665 |
| 2001/0008440 A1 | 7/2001 | Hummel et al. |
| 2002/0001088 A1 | 1/2002 | Wegmann et al. |
| 2002/0008861 A1 | 1/2002 | Singer et al. |
| 2002/0149864 A1 | 10/2002 | Kaneko |
| 2002/0181126 A1 | 12/2002 | Nishioka |
| 2003/0184832 A1 | 10/2003 | Imanishi |
| 2004/0174619 A1 | 9/2004 | Beck et al. |
| 2004/0263812 A1 | 12/2004 | Hummel et al. |
| 2005/0270505 A1 | 12/2005 | Smith |
| 2006/0012885 A1 | 1/2006 | Beder et al. |
| 2006/0221456 A1 | 10/2006 | Shafer et al. |
| 2007/0070316 A1 | 3/2007 | Ehrmann et al. |
| 2007/0165198 A1 | 7/2007 | Kneer et al. |

FOREIGN PATENT DOCUMENTS

| | | |
|---|---|---|
| DE | 101 40 608 | 3/2003 |
| DE | 10 2004 051 838 | 5/2005 |
| EP | 0 291 596 | 1/1994 |
| EP | 0 678 768 | 10/1995 |
| EP | 0 851 304 | 7/1998 |
| EP | 1 014 139 | 6/2000 |
| EP | 1 115 030 | 7/2001 |
| EP | 1 128 218 | 8/2001 |
| EP | 1 231 515 | 8/2002 |
| EP | 1 670 041 | 6/2006 |
| JP | 800 5942 | 1/1996 |
| JP | 811 4703 | 5/1996 |
| JP | 09 050954 | 2/1997 |
| JP | 2000 058436 | 2/2000 |
| JP | 2001 013 306 | 1/2001 |
| JP | 2002 131 513 | 5/2002 |
| WO | WO 99/41624 | 8/1999 |
| WO | WO 2004/036316 | 4/2004 |
| WO | WO 2006/053751 | 3/2005 |
| WO | WO 2005/059617 | 6/2005 |
| WO | WO 2005/059654 | 6/2005 |
| WO | WO 2005/071491 | 8/2005 |
| WO | WO 2005/074606 | 8/2005 |
| WO | WO 2006/125617 | 11/2006 |

OTHER PUBLICATIONS

International Search Reports for the corresponding PCT Application No. PCT/EP2005/012327, filed Nov. 17, 2005.

International Search Reports for the corresponding PCT Application No. PCT/EP2006/007273, filed Jul. 24, 2006.

* cited by examiner

PROJECTION OBJECTIVE OF A MICROLITHOGRAPHIC PROJECTION EXPOSURE APPARATUS

CROSS-REFERENCE TO RELATED APPLICATIONS

This application is a continuation application of U.S. application Ser. No. 11/971,328, filed Jan. 9, 2008, now U.S. Pat. No. 7,830,611, which claims priority to PCT International Application No. PCT/EP2006/007273, filed on Jul. 24, 2006, which claims priority to U.S. Provisional Application Ser. No. 60/702,137, filed Jul. 25, 2005.

BACKGROUND OF THE INVENTION

1. Field of the Invention

The invention relates to projection objectives of microlithographic projection exposure apparatus. Such apparatus are used for the production of large-scale integrated circuits and other microstructured components. The invention relates in particular to projection objectives comprising a manipulator for reducing rotationally asymmetric image errors.

2. Description of Related Art

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system, a mask alignment stage for a aligning the mask, a projection lens and a wafer alignment stage for aligning the wafer coated with the photoresist. The illumination system illuminates a field on the mask that may have the shape of an rectangular slit or a narrow ring segment.

In current projection exposure apparatus a distinction can be made between two different types of apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or scanner, each target portion is irradiated by progressively scanning the mask pattern under the projection light beam in a given reference direction while synchronously scanning the substrate parallel or anti-parallel to this direction. The ratio of the velocity of the wafer and the velocity of the mask is equal to the magnification of the projection lens, which is usually smaller than 1, for example 1:4.

It is to be understood that the term "mask" (or reticle) is to be interpreted broadly as a patterning means. Commonly used masks contain transmissive or reflective patterns and may be of the binary, alternating phase-shift, attenuated phase-shift or various hybrid mask type, for example. However, there are also active masks, e.g. masks realized as a programmable mirror array. An example of such a device is a matrix-addressable surface having a viscoelastic control layer and a reflective surface. More information on such mirror arrays can be gleaned, for example, from U.S. Pat. No. 5,296,891 and U.S. Pat. No. 5,523,193. Also programmable LCD arrays may be used as active masks, as is described in U.S. Pat. No. 5,229,872. For the sake of simplicity, the rest of this text may specifically relate to apparatus comprising a mask and a mask stage; however, the general principles discussed in such apparatus should be seen in the broader context of the patterning means as hereabove set forth.

One of the essential aims in the development of projection exposure apparatus is to be able to lithographically generate structures with smaller and smaller dimensions on the wafer. Small structures lead to high integration densities, which generally has a favorable effect on the performance of the microstructured components produced with the aid of such apparatus.

The size of the structures which can be generated depends primarily on the resolution of the projection objective being used. Since the resolution of projection objectives is inversely proportional to the wavelength of the projection light, one way of increasing the resolution is to use projection light with shorter and shorter wavelengths. The shortest wavelengths currently used are 248 nm, 193 nm or 157 nm and thus lie in the (deep) ultraviolet spectral range.

Another way of increasing the resolution is based on the idea of introducing an immersion liquid with a high refractive index into an immersion interspace, which remains between a last lens on the image side of the projection objective and the photoresist or another photosensitive layer to be exposed. Projection objectives which are designed for immersed operation, and which are therefore also referred to as immersion objectives, can achieve numerical apertures of more than 1, for example 1.4 or even higher.

The correction of image errors (i.e. aberrations) is becoming more and more important for projection objectives with particularly high resolution. Many ways in which image errors can be corrected in projection objectives are known in the prior art.

The correction of rotationally symmetric image errors is comparatively straightforward. An image error is referred to as being rotationally symmetric if the wavefront deformation in the exit pupil is rotationally symmetric. The term wavefront deformation refers to the deviation of a wave from the ideal aberration-free wave. Rotationally symmetric image errors can be corrected, for example, at least partially by moving individual optical elements along the optical axis.

Correction of those image errors which are not rotationally symmetric is more difficult. Such image errors occur, for example, because lenses and other optical elements heat up rotationally asymmetrically. One image error of this type is astigmatism, which may also be encountered for the field point lying on the optical axis. Causes of rotationally asymmetric image errors may, for example, be a rotationally asymmetric, in particular slit-shaped, illumination of the mask, as is typically encountered in projection exposure apparatus of the scanner type. The slit-shaped illumination field causes a non-uniform heating of the optical elements, and this induces image errors which often have a twofold symmetry.

However, image errors with other symmetries, for example threefold or fivefold, or image errors characterized by completely asymmetric wavefront deformations are frequently observed in projection objectives. Completely asymmetric image errors are often caused by material defects which are statistically distributed over the optical elements contained in the projection objective.

In order to correct rotationally asymmetric image errors, U.S. Pat. No. 6,338,823 B1 proposes a lens which can be selectively deformed with the aid of a plurality of actuators distributed along the circumference of the lens. Since the two optical surfaces of the deformable lens are always deformed simultaneously, the overall corrective effect is obtained as a superposition of the individual effects caused by the two deformed optical surfaces. This is disadvantageous because it is thereby very difficult to correct a particular wavefront deformation, which is determined by measurements or simulation, and has been generated by the other elements of the projection objective. The individual effects of the two deformed surfaces furthermore partially compensate for each other, so that the lens has to be deformed quite strongly in order to obtain a sufficient corrective effect.

US Pat. Appl. No. 2001/0008440 A1 discloses a manipulator suitable to correct image errors for a projection objective, in which two membranes or thin plane-parallel plates enclose a cavity. The membranes or plates can be deformed by varying the pressure of a fluid (a gas or a liquid) contained in the cavity. A rotationally asymmetric deformation can be achieved by rotationally asymmetric framing of the membranes or plates. A disadvantage with this known manipulator, however, is that only the fluid pressure is available as a variable parameter. This implies, for example, that the symmetry of the deformation is once and for all fixed by the framing of the membranes or plates and thus cannot be changed.

WO 2006/053751 A2 discloses various adjustable manipulators for reducing a field curvature. In some embodiment optical elements such as lenses or membranes are deformed by changing the pressure of liquids adjacent the optical elements.

U.S. Pat. No. 5,665,275 discloses a prism which has a variable prism angle. A variation of the prism angle is achieved using two plane-parallel plates which can be mutually deflected via a deformable connecting ring. The interspace defined by the plates and the connecting ring is filled with an organic liquid. The connecting ring is deformed by an actuator engaging on it. This device is particularly suited for an anti-vibration optical system in a photographic system.

U.S. Pat. No. 5,684,637 discloses a spectacle lens having a cavity which is filled with a liquid. For the correction of rotationally asymmetric image errors, for example astigmatism, deformable membranes are provided that have a non-circular circumference. Since always a plurality of optical surfaces are simultaneously deformed by changing the pressure of the liquid, it is difficult to widely correct a certain (measured) wavefront deformation without introducing a plurality of other deformations.

There are many other liquid lenses in the prior art having deformable lens surfaces for changing the focal length. With these known liquid lenses the deformation is always rotationally symmetric, and hence they are not suitable for correcting rotationally asymmetric image errors. Examples of such variable focal length lenses can be found in Japanese Pat. Appls. JP 811 4703 A, JP 2002 131 513 A and JP 2001 013 306 A, in EP 0 291 596 B1 and in U.S. Pat. No. 4,289,379.

SUMMARY OF THE INVENTION

It is an object of the present invention to provide a projection objective of a microlithographic projection exposure apparatus, which has a manipulator for reducing rotationally asymmetric image errors. More particularly, the manipulator shall have a simple design and shall make it possible to correct a large variety of rotationally asymmetric field or pupil related image errors.

According to the invention, this object is achieved by a projection objective having a manipulator, which comprises:
 a) a first optical element of a refractive type,
 b) a second optical element,
 c) an interspace formed between the first optical element and the second optical element,
 d) a liquid filling the interspace, and
 e) at least one actuator which is coupled to the first optical element such that operation of the at least one actuator causes a rotationally asymmetric deformation of the first optical element Since the at least one actuator acts exclusively on the first optical element, the at least one actuator deforms both surfaces of the first optical element without simultaneously causing an (at least generally) undesired deformation of the second optical element. However, one surface of the first optical element contacts the liquid, and thus a deformation of this surface has only a very small optical effect if the ratio of the refractive index $n_E$ of the first optical element and the refractive index $n_L$ of the liquid is close to 1. With a refractive index ratio $n_E/n_L=1$, a deformation of this surface has no optical effect at all.

A deformation of the first optical element by the at least one actuator therefore changes only the optical effect of the other surface of the first optical element, i.e. the surface pointing away from the liquid. This is true exactly for a refractive index ratio $n_E/n_L=1$, but is at least substantially true with a refractive index ratio $n_E/n_L\approx1$, for example $0.99<n_E/n_L<1.01$. Even with a larger or smaller refractive index ratio, for example $n_E/n_L=1.1$ or 0.9, there is a substantial reduction of the optical effect at the interface between the liquid and the optical element if compared to a situation where the deformed first optical element is surrounded by a gas having a refractive index of 1. For the sake of simplicity and conciseness it is therefore assumed that the refractive index ratio $n_E/n_L$ equals 1.

Since the manipulator makes it possible to deform effectively only one single optical surface, the corrective effect can be adjusted much better. The generally undesired superposition of the optical effects caused by two simultaneous deformations, as always occurs in the prior art, is avoided.

The use of one or more actuators is a significant advantage in comparison to prior art solutions. This is because only the provision of actuators fully exploits the potential and design freedom of a single deformable optical surface. With prior art manipulators, in which optical surfaces are deformed only by changing the liquid pressure, it is not possible to produce complicated and varying deformations of this optical surface. However, according to the present invention it may be envisioned to additionally change the pressure of the liquid for modifying the deformation.

By suitably arranging and driving the actuators, it is thus possible to correct not only simple rotationally asymmetric wavefront deformations, but even fairly complex wavefront deformations which can be mathematically described as a superposition of higher Zernike polynomials.

In this context, the term "liquid" is also intended to include highly viscous gels or the like. The liquid must merely have the property that it is sufficiently transparent at the wavelength of the projection light and does not (substantially) transmit a deformation of the first optical element onto the second optical element.

The term "deformation" is meant to denote the difference between two shapes of the first optical element in two different actuation states of the one or more actuators. Therefore a rotationally asymmetric deformation does not necessarily imply that the first optical element is nonrotationally deformed after changing the actuation states. For example, the first optical element may have a rotationally asymmetric shape before, and the actuator deforms the first optical element such that it receives a rotationally symmetric shape.

The term "rotationally asymmetric" is used herein in the sense of "not axisymmetric". Thus a shape is referred to as being rotationally asymmetric if rotation around a reference axis around an arbitrary angle results in a different shape. A shape is referred to as having an m-fold (rotational) symmetry if there are only m angles for which a rotation around the reference axis results in the same shape. A shape having an m-fold rotational symmetry is therefore nevertheless rotationally asymmetric in this sense.

The first optical element of the manipulator may be designed as a plane-parallel plate. Such a plane-parallel plate is highly suitable as a deformable element because it is then simpler to calculate the forces that must act externally on the plate in order to generate a desired deformation. The thinner such a plane-parallel plate is, the smaller these forces are. A very thin plate, however, may have the disadvantage that gravity disadvantageously bends the plate, and a very thin plate may possibly even react too sensitively to the application external forces. Plate thicknesses in the range of a few millimeters have therefore been found to be particularly favorable, although this in no way precludes the use of thinner or thicker plates or of thin membranes (pellicles) as deformable first optical element.

The interspace which can be filled with a liquid may have, in a direction along an optical axis of the projection objective, a maximum thickness of less than 1 mm, and preferably less than 2 µm. A small amount of liquid has the advantage that pressure or temperature variations in the liquid affect the optical properties of the manipulafor less strongly.

Depending on the number, arrangement and design of the actuators acting on the first optical element, any deformations of the first optical element can be achieved within wide limits. In order to correct image errors, however, it is usually sufficient to generate deformations having an m-fold symmetry or a superposition of a plurality of m-fold symmetries, where m=2, 3, 4, . . . .

In principle, the at least one actuator may engage on the first optical element in the ways known in the prior art. If the at least one actuator exerts tensile or compressive forces on the first optical element in the radial direction, as is described in EP 0 678 768 A, then the thickness of the first optical element will be changed rotationally asymmetrically without substantial bending being caused. Often a bending of the first optical element is more desirable, which implies that the actuators are configured to exert bending moments on the first optical element. The application of forces in a direction other than the radial direction is described in more detail in U.S. Pat. No. 6,388,823 B1.

For rotationally asymmetric image errors which are caused by a slit-shaped illumination field, the symmetry of the image errors and therefore the symmetry of the deformations required for the correction can be predicted very well. The actuators may then be arranged along a circumference of the first optical element and distributed at the appropriate positions. If the manipulator is also meant to correct other image errors, the symmetry of which is not known beforehand, then it is expedient to configure the actuators such that at least two deformations of the first optical element can be generated with different symmetry.

The second optical element may be of a reflective type (i.e. a mirror). In general, however, the second optical element will be a further refractive optical element which may be curved on one or both sides so as to form a lens, or it may also be designed as a plane-parallel plate. Actuators may also engage on the second optical element in order to generate an additional deformation. This deformation may be rotationally symmetric or asymmetric.

In order to achieve optimal decoupling of the first optical element from the second optical element, the manipulator may have a pressure equalizer for maintaining a constant pressure of the liquid in the immersion space. In the event of a deformation of the first optical element, this prevents compressive forces from being transmitted through the liquid onto the second optical element, where they may cause an undesired deformation.

In the simplest case, the pressure equalizer is a pressure equalizing container which communicates with the interspace through a sealed channel. A liquid level is formed against a surrounding gas volume in the pressure equalizing container. If the volume of the interspace is increased in the event of a deformation of the first optical element, then liquid can flow in from the equalizing container. In the event of a volume reduction, liquid flows back through the channel into the equalizing container. The pressure in the interspace is then equal to the surrounding gas pressure plus the hydrostatic pressure of the liquid in the equalizing container.

If the manipulator is arranged in or in close vicinity of a pupil plane of the projection objective, the same corrective effect can be achieved for all field points. The manipulator lies in the vicinity of a pupil plane when the deformable surface of the first optical element has a vertex lying at a distance from a pupil plane such that $h_{cr}/h_{mr}<0.5$. Here, $h_{cr}$ is the height of a central ray which passes through the object plane at a maximal distance from the optical axis, on the one hand, and through the middle of the pupil plane, on the other hand. The value $h_{mr}$ is defined as the height of a marginal ray which passes through the object plane on the optical axis, on the one hand, and through the pupil plane at its margin, on the other hand. The deformable surface of the first optical element is referred to of being arranged in the immediate vicinity of a pupil plane when $h_{cr}/h_{mr}<0.15$.

However, the manipulator may equally be arranged at other positions within the projection objective. For correcting field dependent image errors such as field curvature, the manipulator should be arranged in or close to a field plane, for example the object or image plane of the projection objective. If the projection objective has an intermediate image plane, this would be an ideal position for a manipulator correcting field dependent image errors.

In an advantageous embodiment the actuator is fastened to a front or a rear surface of the first optical element. The actuator is configured to produce on the first optical element compressive and/or tensile forces along directions that are at least substantially tangential to the surface. Such an actuator is advantageous because it does not require an additional rigid body on which the actuator rests.

Such an actuator may be realized as a layer which is supplied to the surface. The layer has a variable dimension along at least one direction tangential to the surface. Layers having such a property may be formed, for example, by piezo electric materials, or by materials having a coefficient of thermal expansion that is different from the coefficient of thermal expansion of the first optical element.

In the latter case the temperature of the material may be controllably changed with the help of a device that may be configured to direct radiation onto the layer, or to apply a voltage to the layer, for example.

A wide variety of deformations may be produced with a plurality of layer actuators having the shape of ring segments. The ring segments form a circular ring which is centered with respect to an optical axis of the projection objective.

Thin actuator layers furthermore are particularly suitable to distribute the actuators over an optical surface within an area through which projection light propagates. If such actuators are opaque at the wavelength of the projection light, the manipulator has to be arranged in or in close proximity to a pupil plane of the projection objective. If the actuators are at least substantially transparent at the wavelength of the projection light, also positions outside a pupil plane may be contemplated.

It is to be understood that the aforementioned (layer) actuator producing compressive and/or tensile forces may advantageously be used also in other kind of optical manipulators, for example manipulators which do not contain liquids and/or which produce only symmetric deformations.

According to another embodiment of the invention, one or more additional sensors are fastened to a front or rear surface of the first optical element. The sensors are configured to measure a deformation of the first optical element produced by the actuator. Other devices that measure the deformation and/or the forces producing the deformations are contemplated as well.

In another advantageous embodiment a plurality of actuators are distributed over an area, through which projection light is allowed to propagate, of a surface of the first optical element which is opposite to a surface which is in contact with the liquid. In this way the actuators do not get in the contact with the liquid, and thus undesired interactions between the liquid and the actuators are prevented. If the actuators are formed by layer actuators, they do not require another transparent optical member to rest on. If conventional actuators are used, a rigid optical element of a refractive type may be provided on which the plurality of actuators rest.

The variety of possible deformations may be further increased by providing a further interspace formed between the second optical element and a third optical element. Both the second optical element and the third optical element are of a refractive type. Means, for example a further actuator coupled to the third optical element, are provided for deforming the third optical element. The deformation of the third optical is preferably, but not necessarily, rotationally asymmetric as well. Such a configuration may also be advantageous if the interspaces are not filled by a liquid, but by gases.

In addition to the actuators, the pressure of the liquid may be used for causing a deformation of the first optical element. To this end a device for changing the pressure of the liquid, such as a pump or a deformable membrane, may be used. This concept is also applicable if a gas is used instead of the liquid.

The first optical element may have a shape in its undeformed state which is rotationally asymmetric. If the pressure of the adjacent liquid is changed, this will cause a rotationally asymmetric deformation that may correct rotationally asymmetric wavefront deformations. A rotationally asymmetric shape of the first optical element may also be useful, however, if it is (solely) deformed with the help of actuators.

The rotationally asymmetric shape may either be the result of a rotationally asymmetric contour or of a thickness distribution which is, in the undeformed state of the first optical element, rotationally asymmetric. In the latter case it may be advantageously if the first optical element has a first surface which is in contact to the liquid and has a rotationally asymmetric shape. A second surface opposite the first surface has a rotationally symmetric shape. In its undeformed state such a first optical element has a rotationally symmetric optical effect, because the rotationally asymmetric surface is in contact to the liquid and thus does not (substantially) contribute to the overall optical effect.

Also this concept of providing a rotationally asymmetric thickness distribution may be advantageously used with other kinds of manipulators, for example manipulators in which the interspace is not filled by a liquid, but by a gas, or in which deformations are only caused by gas pressure changes.

In order to drive the at least one actuator, the projection exposure apparatus may comprise a controller which is connected to a sensor arrangement in order to determine the image errors. The sensor arrangement may, for example, comprise a CCD sensor which can be positioned in an image plane of the objective or in a field plane conjugate therewith. The manipulator, the controller and the sensor arrangement may together form a closed feedback loop.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
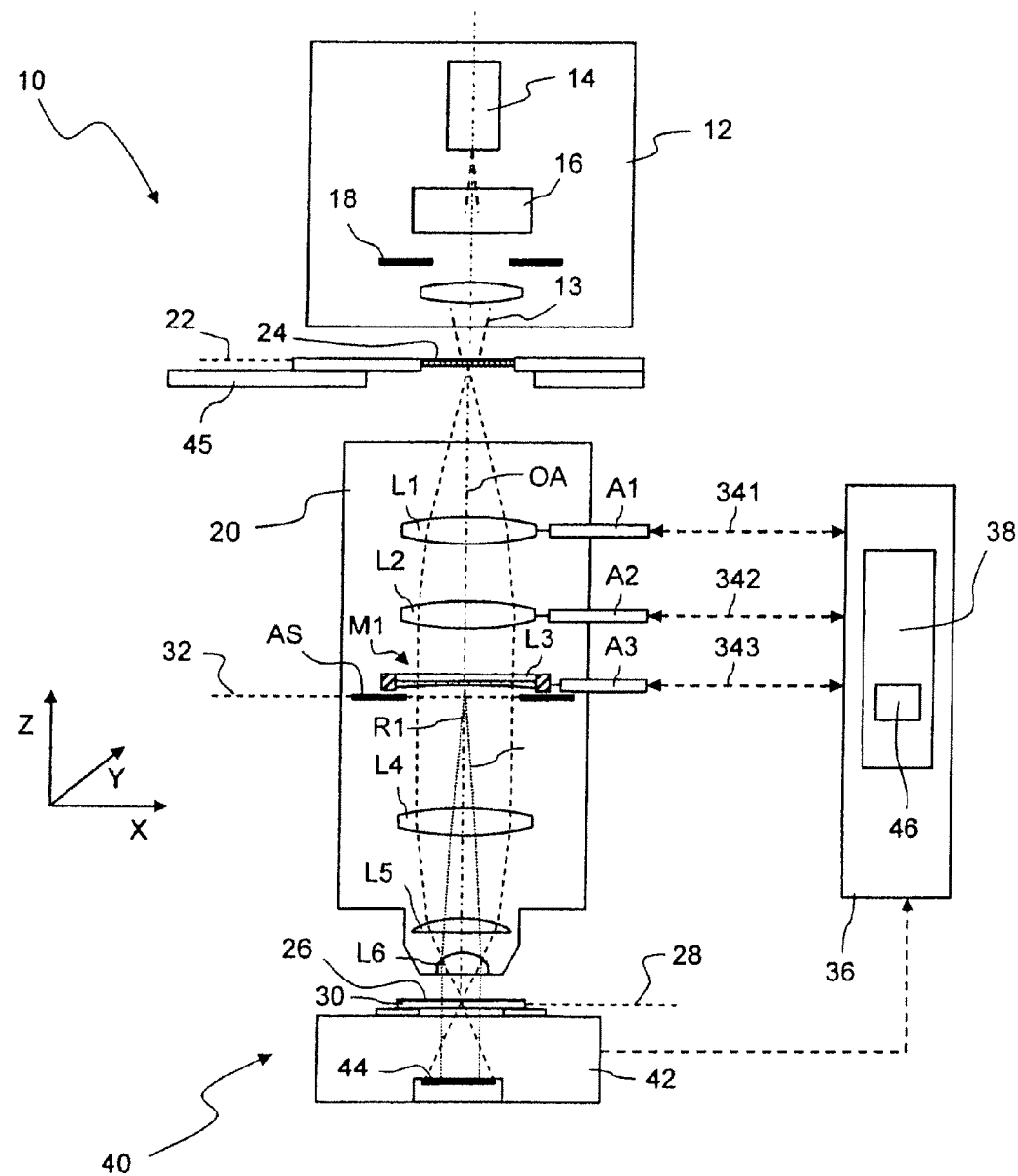
FIG. 1 is a meridional section in a highly schematized representation through a projection exposure apparatus according to the invention, with a projection objective and a manipulator arranged therein for correcting rotationally asymmetric image errors.

FIG. 1 shows, in a highly schematized meridian section, a microlithographic projection exposure apparatus 10 in a projection mode. The projection exposure apparatus 10 comprises an illuminating system 12 for generating projection light 13. The illumination system 12 contains a light source 14, illumination optics 16 and a field stop 18. The illumination optics 16 make it possible to set different illumination angle distributions.

The projection exposure apparatus 10 further comprises a projection objective 20, which contains an aperture stop AS and a plurality of optical elements. For the sake of clarity, only a few optical elements are schematically illustrated in FIG. 1 and denoted by L1 to L6. The projection objective 20 projects a reduced image of a mask 24, which is arranged in an object plane 22 of the projection objective 20, onto a photosensitive layer 26 which is arranged in an image plane 28 of the projection objective 20. The photosensitive layer 26 may be formed by a photoresist applied on a wafer 30.

The optical elements L1, L2 and L3 are provided with actuator systems A1, A2 and A3 (indicated only schematically) which can change the optical effect of the optical elements L1, L2 or L3. In this embodiment the optical element L1 is a biconvex lens that can be moved within the XY plane with a high accuracy by the actuator system A1. The actuator system A2 makes it possible to change the position of the optical element L2, which is a biconvex lens, too, along the direction perpendicular thereto, i.e. along the Z axis. The optical element L3 is a plane-parallel plate that forms, together with the actuator system A3, a manipulator M1 which will be explained in more detail below with reference to FIGS. 2 to 4.

The actuator systems A1 to A3 are connected via signal lines 341 to 343 to a controller 36 that individually controls the actuator systems A1 to A3. To this end, the controller 36 comprises a computer 38 that determines which control instructions should be communicated to the actuator systems A1 to A3 in order to improve the imaging properties of the projection objective 20.

The projection objective 20 represented here by way of example is assumed to be telecentric on the image side. This means that the exit pupil lies at infinity. The term exit pupil refers to the image-side image of the aperture stop AS. In FIG. 1, rays R1, R2 represented by dots indicate how points in a pupil plane 32, in which the aperture stop AS is arranged, are imaged at infinity by the subsequent optical elements L4 to L6.

Even with careful mounting and adjustment of the projection objective 20, it will generally have image errors which degrade the imaging of the mask 24 onto the photosensitive layer 26. There may be various causes of the image errors.

On the one hand, there are image errors which result from the design of the projection objective 20, i.e. in particular from the specification of the dimensions, materials and spacings of the optical elements contained in the projection objective 20. One example of this is the intrinsic birefringence of calcium fluoride ($CaF_2$), which becomes increasingly noticeable at wavelengths shorter than 200 nm. The effect of birefringence is generally that the polarization state of the projection light changes in an undesirable way when it passes through the birefringent material.

On the other hand, there are image errors which are attributable to production or material defects. Generally this kind of image errors can only be corrected once the projection objective has finally been mounted. Examples of production defects include so-called form defects, i.e. deviations from a real surface from the shape specified by the designer. Material defects do not, at least generally, affect the condition of refractive or reflective surfaces, but usually lead to inhomogeneous refractive index profiles or locally varying birefringence properties inside the optical elements. Material defects may be due to imperfections of the materials from which the optical elements are made. Sometimes, however, these defects are not present at the beginning, but occur after many hours or months of operation. Often this kind of material defects is caused by the high-energy projection light that irreversibly compacts the lens material.

There are also image errors which do not occur until during the projection operation but are reversible in nature, and therefore recede after the end of the projection operation. The most important cause of such image errors is the heat input by projection light. This heat absorbed by the lens or mirror material often leads to an inhomogeneous temperature distribution and therefore also to a deformation of the optical elements. The deformation is usually not rotationally symmetric, but often has an m-fold symmetry where m=2, 3, 4, . . . . As stated above, an m-fold symmetry means that the optical element has its original shape again after a rotation through 360°/m. For projection exposure apparatus in which the mask is illuminated by a slit-shaped illumination field, m is often 2.

Form defects and deformations of the optical elements lead to wavefront deformations, i.e. deviations from the ideal waveform in the exit pupil. In the following it is described how such wavefront deformations can be at least partially corrected with the manipulator M1.

First, the projection exposure apparatus is converted from a projection mode into a measurement mode. A shearing interferometer 40, which allows very rapid analysis of the imaging properties of the projection objective 20, is integrated into the projection exposure apparatus 10. The shearing interferometer 40 uses the illumination system 12 and a special test mask. When the projection exposure apparatus is converted into the measurement mode, the test mask is introduced into the object plane 22 of the projection objective with the aid of a first displacement device 45 which is usually referred to as a reticle stage. The test mask thus replaces the mask 24 that shall finally be projected. With a second displacing device 42 (wafer stage) for moving the wafer 30 parallel to the image plane 28, the wafer 30 is replaced by a diffraction grating. Other parts of the shearing interferometer 40, i.e. a photosensitive sensor 44 which may for example be a CCD chip, are arranged inside the displacing device 42. The function of the shearing interferometer 40 is known as such in the art, see, for example, US 2002/0001088 A1, and will therefore not be described in further detail. For selected field points, the shearing interferometer 40 makes it possible to determine the wavefront in the exit pupil. The greater the image errors in the projection objective 20 are, the more the wavefront measured for a field point will deviate from the ideal waveform in the exit pupil.

As a matter of course, any other of the plurality of known devices and methods for determining image errors may be used instead or additionally to the shearing interferometer 40.

In the embodiment shown, it is assumed that a wavefront deformation due to an astigmatic image error can be described in the exit pupil (for a particular field point) by a Zernike polynomial $Z_5$. Such a wavefront deformation with twofold symmetry cannot generally be corrected by the optical elements L1 and L2 which can be moved with the aid of the actuators A1 and A2.

The computer 38 in the controller 36 of the projection exposure apparatus 10 now compares the measured actual wavefront profile with a stored target wavefront profile in a comparator 46 and, on the basis of any deviations found, calculates a suitable bending of the optical element L3 so that the wavefront deformations are reduced for the field point in question. The calculated bending leads to wavefront deformations which are complementary with the measured wavefront deformations and therefore compensate for them. Preferably these calculations are repeated for a plurality of field points, and a shape of the optical element L3 is determined that reduces, on the average using a certain averaging function (arithmetic, quadratic or with weighting coefficients, for example), the measured wavefront deformations for all contemplated field points. The actuator A3 is then controlled such that a compensating deformation with an opposite effect is imposed on the wavefronts in the projection objective 20.

The structure of the manipulators M1 will be explained in more detail below with reference to FIGS. 2 and 3, which show the manipulator M1 on an enlarged scale in a meridian section along the line II-II and a view from below, respectively.

The manipulator M1 comprises a first plane-parallel plate 50 and a second plane-parallel plate 52, arranged in parallel and spaced apart by a small distance. The two plates 50, 52 each consist of a material which is transparent at the wavelength λ of the projection light. For a wavelength λ=193 nm, an example of a suitable material for the plates 50, 52 is synthetic quartz glass which has a refractive index $n_{SiO2}$ of approximately 1.56. Materials such as LiF, NaF, $CaF_2$ or $MgF_2$ are also suitable. For a wavelength λ=157 nm, materials such as $CaF_2$ or $BaF_2$ should be used because synthetic quartz glass is not sufficiently transparent at these short wavelengths.

The two plates 50, 52 are framed so that an interspace 54 remaining between them is sealed in a fluid-tight fashion. In the sectional representation of FIG. 2, a first frame 56 for the first plate 50 and a second frame 58 for the second plate 52 are represented in a simplified way as annular frames which are kept apart by an intermediate ring 60. The intermediate ring 60 contains seals (not shown in detail) which ensure fluid-tight closure of the interspace 54.

The interspace 54 is completely filled with a liquid 62. In the embodiment shown, the interspace 54 has a relatively large height for the sake of clarity. However, it is often more favorable for the two plates 50, 52 to be separated from each other merely by a liquid film. The thickness of the film, measured along the direction of an optical axis OA of the projection objective, may be as small as about 2 μm.

The liquid 62 may, for example, be highly pure deionized water which has a refractive index $n_{H2O}$ of approximately 1.44 at a temperature of 22° C. If the second plate 52 consists of quartz glass, then the refractive index ratio $V=n_{SiO2}/n_{H2O}$ at the upper optical surface 64 of the second plate 52 in FIG. 1 is less than 1.01, which corresponds to a relative refractive index difference of 1%. Owing to this refractive index ratio V of close to 1 at the upper surface 64 of the second plate 52, the upper surface 64 has only a minimal optical effect. The effect of the upper optical surface 64 can be reduced even further by bringing the refractive indices of the liquid 62 on the one hand, and the material of the second plate 52 on the other hand, even closer to each other. If water is used as the liquid 62 and, for example, LiF which has a refractive index $n_{LiF}$ of approximately 1.44 at a wavelength of 193 nm is used as the material for the second plate 52, then the relative refractive index ratio $V=n_{LiF}/n_{H2O}$ is less than 0.1%.

Other substances may be envisioned as liquid 62 as well. All liquids that have been proposed as immersion liquids for microlithographic immersion objectives are principally suitable, for example. Since the liquid 62 does not get into contact with the photoresist or any other photosensitive layer 26, there are no restrictions as far compatibility with the photoresist is concerned.

The interspace 54 is in communication with a reservoir 68 through a channel 66 formed in the intermediate ring 60. The reservoir 68 is arranged so that the liquid level lies above the interspace 54 when the projection objective 20, with the manipulator M1 installed in it, is in the operating state. In this way, the pressure of the liquid 62 in the interspace 54 is equal to the sum of the pressure of the surrounding gas volume and the hydrostatic pressure which the liquid 62 generates in the reservoir 68.

The interspace 54 may also be connected to a drain channel (not shown) through which the liquid 62 supplied from the reservoir is drained. Both channels may be part of a closed circulation system that contains purifying means for purifying the liquid 62 and also temperature control means for keeping the temperature of the liquid 62 at a desired target temperature. The temperature of the liquid 62 may be controlled such that the refractive index ratio V is as close to 1 as possible. Additionally or alternatively, the temperature of the liquid 62 may be used as an additional parameter for varying the optical effect produced by the manipulator M1.

On the other side from the intermediate ring 60, the second frame 58 for the second plate 52 is adjoined by a holding ring 70 for actuators 711 to 718, which together form the actuator system AS3. The distribution of the actuators 711 to 718 over the circumference of the second plate 52 can be seen more clearly in the view from below in FIG. 3. The actuators 711 to 718 are represented in a simplified fashion as threaded pins, which are adhesively bonded or connected in another way to the second plate 52. Via geared transmissions (not shown in detail) in the holding ring 70, each individual threaded pin of the actuators 711 to 718 can be moved independently of one another in the manner of a micrometer drive along the longitudinal axis of the threaded pins with a very high accuracy, as indicated by double arrows in FIG. 2. The actuators 711 to 718 can thereby exert bending moments on the second plate 52, which lead to its deformation. The shape of the deformation is determined by the way in which the actuators 711 to 718 are arranged along the circumference of the second plate 52, and by the direction and size of the forces exerted on the second plate 52.

Figure 2:
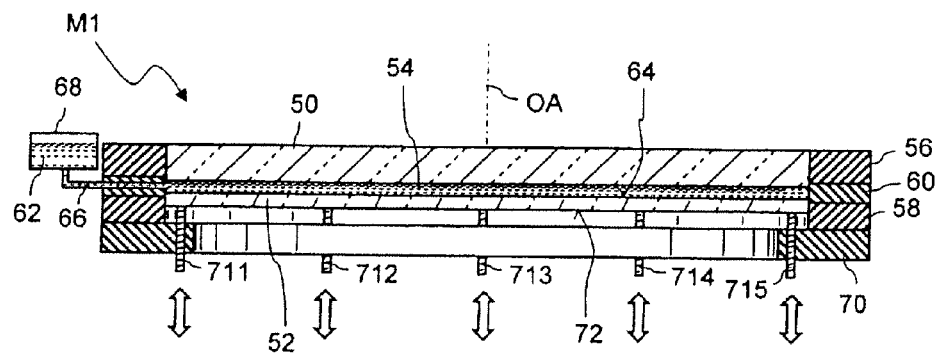
FIG. 2 is an enlarged simplified meridional section along line II-II through the manipulator of FIG. 1.
Figure 3:
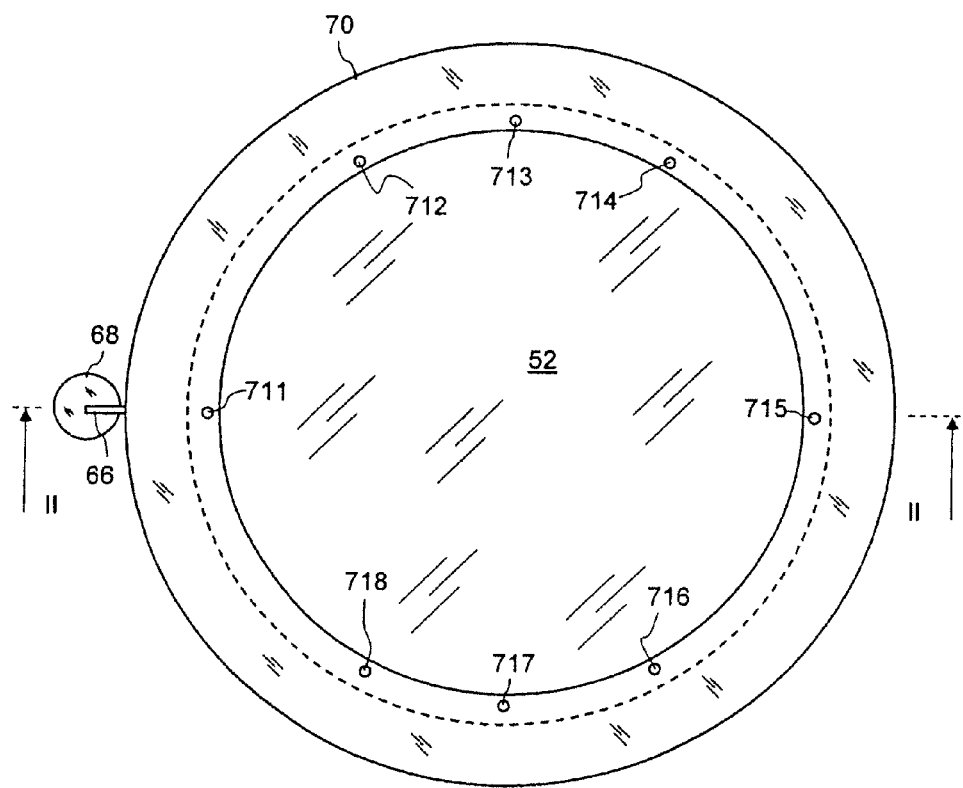
FIG. 3 is a view from below of the manipulator shown in FIG. 2.

The representation of the actuators 711 to 718 as threaded pins in FIGS. 2 and 3 is merely exemplary. Other types of actuators, for example piezo elements, are generally used in order to exert particularly fine-tuned forces. Other examples of actuators will be described further below with reference to FIGS. 6 to 10.

Figure 4:
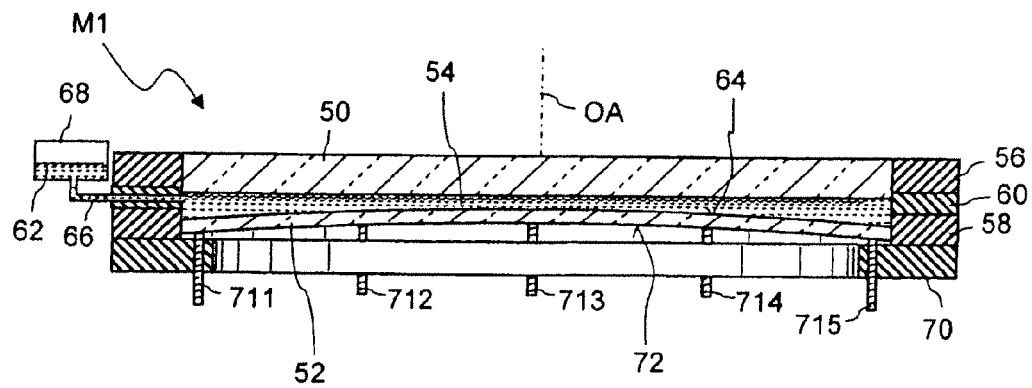
FIG. 4 is a meridional section through the manipulator of FIGS. 2 and 3 with its deformable optical element in a deformed state.

In the state represented in FIGS. 2 and 3, it is assumed that the actuators 711 to 718 are not exerting any bending moments on the second plate 52 so that it has its original configuration, which is plane-parallel in this embodiment. If the actuators 711 and 715, which lie opposite each other in the meridian plane shown in FIG. 2, are now actuated by screwing the threaded pins downward out of the holding ring 70, then the second plate 52 will bend as shown in FIG. 4. The actuators 712 and 714, and 716 and 718, are readjusted accordingly so that they are connected force-free to the second plate 52. In this state as shown in FIG. 4, the second plate 52 is deformed in a saddle fashion with twofold symmetry. Such a deformation is suitable for correcting a wavefront deformation that can be described by the Zernike polynomial $Z_5$, which may be caused by a slit-shaped illumination field on the mask 24.

For the sake of clarity, the deformation of the second plate 52 due to the actuators 711 to 718 is represented greatly exaggerated in FIG. 4. In fact, bending by about 500 or even a less than 50 nanometers may be sufficient to achieve the desired wavefront deformation. This high sensitivity is mainly due to the fact that, owing to the refractive index ratio lying close to 1, the upper optical surface 64 of the second plate 52 does not compensate for the optical effect which originates from the lower optical surface 72.

The volume of the interspace 54 generally changes in the event of a deformation of the second plate 52. With the deformation shown in FIG. 4, for example, a slight volume increase of this volume takes place. In order to prevent compressive forces exerted on the first plate 50 through the fluid 62 during the deformation of the second plate 52, the liquid 62 is allowed to flow in from the reservoir 68 through the channel 66.

The resultant lowering of the liquid level in the reservoir 68 is represented exaggeratedly in FIG. 4; in fact, the volume changes which occur are so small that the liquid level in the reservoir 68 changes only insignificantly. The hydrostatic pressure therefore remains almost constant in the interspace 54. This ensures that the second plate 52 can be deformed entirely independently of the first plate 50 with the aid of the actuators 711 to 718.

If it is found during the analysis with the aid of the shearing interferometer 40 that a different deformation of the second plate 52 is necessary in order to correct the image errors, then the controller 36 may suitably drive the actuators 711 to 718 another way. A deformation with threefold symmetry, for example, can be generated by simultaneously actuating the actuators 712, 715 and 718, which respectively make an angle of 120° between one another. The actuators 711, 714 and 716 angularly offset by 60° thereto may execute a corresponding countermovement. It is furthermore possible to superpose a plurality of deformations, so that even fairly complex wavefront deformations can become corrected. To this end, the excursions of the individual actuators 711 to 718 are simply added up.

Figure 5:
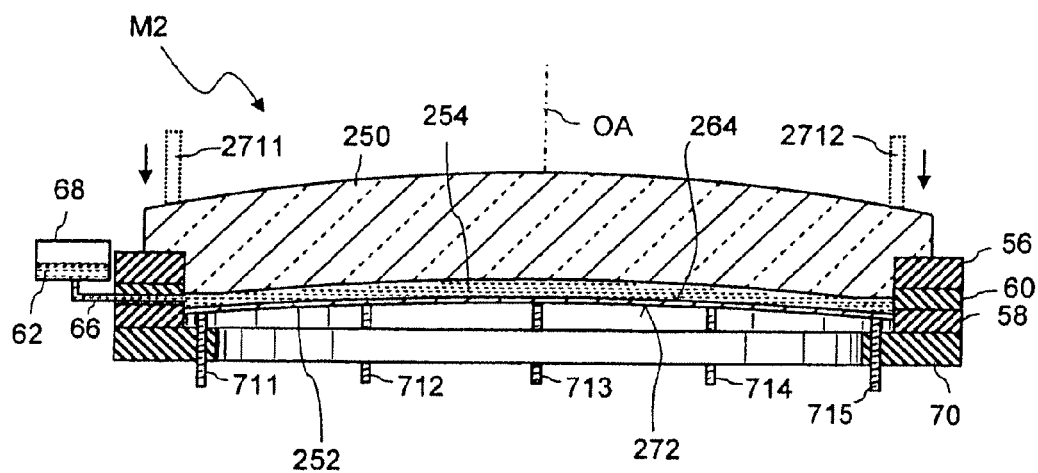
FIG. 5 is a meridional section through a manipulator according to another embodiment, in which the liquid-filled interspace is formed between lenses having curved surfaces.

FIG. 5 shows another embodiment for a manipulator denoted in its entirety by M2 in a meridional section similar to FIG. 2. For like parts use is made of the same reference numerals as in FIGS. 2 to 4, and for parts corresponding to one another use is made of reference numerals augmented by 200. In the manipulator M2 the upper plane-parallel plate 50 of the embodiment shown in FIGS. 2 to 4 is replaced by a thick meniscus lens 250, and the lower plane-parallel plate 52 is replaced by a thin meniscus lens 252. The liquid film in the interspace 254 is therefore curved. The manipulator M2 consequently has, in its entirety, the effect of a meniscus lens. The thick meniscus lens 250 may alternatively or additionally be deformed. To this end, FIG. 5 indicates actuators 2711, 2712 which can generate bending moments in the thick meniscus lens 250. The manipulator M2 therefore allows more versatile correction of wavefront deformations.

Figure 6:
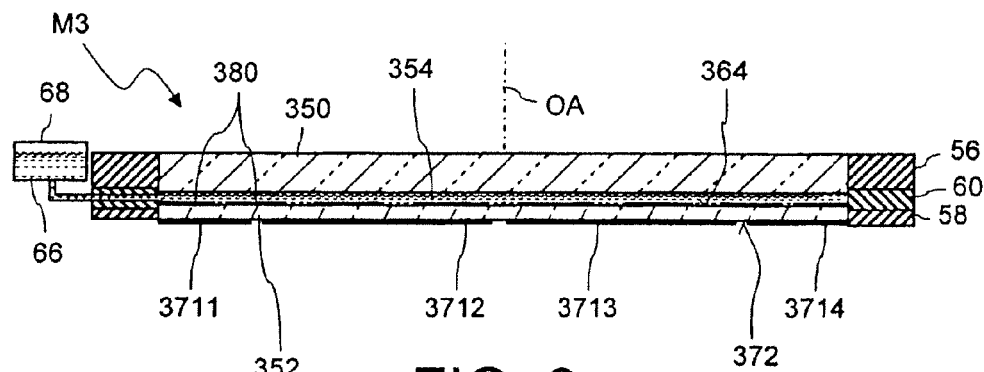
FIG. 6 is a meridional section along line VI-VI through a manipulator according to another embodiment comprising actuator layers.
Figure 7:
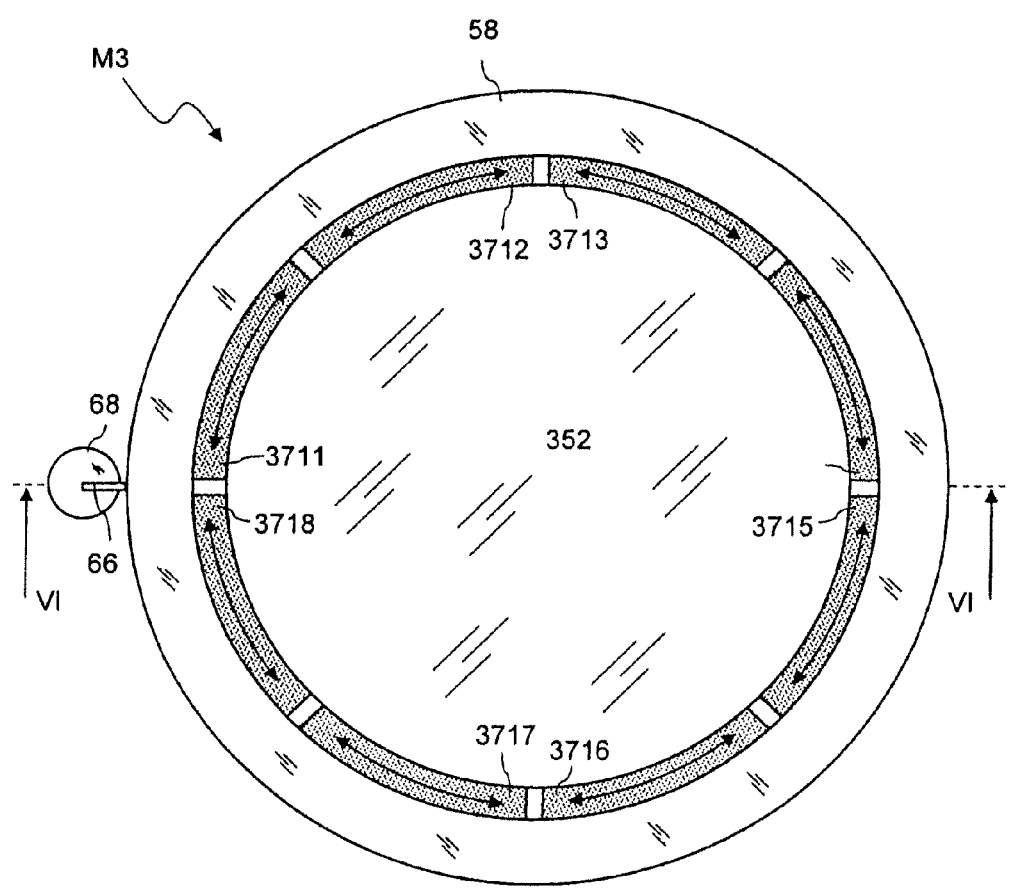
FIG. 7 is a view from below of the manipulator shown in FIG. 6.

FIGS. 6 and 7 show another embodiment of a manipulator M3 in a meridional section along line VI-VI and in a view from below, respectively. For like parts the same reference numerals as in FIGS. 2 to 4 are used, and for parts corresponding to one another use is made of reference numerals augmented by 300. The manipulator M3 is equally suitable for being positioned within the projection objective 20 close to the pupil plane 32 or at other positions along the optical axis OA.

The manipulator M3 differs from the manipulators M1 and M2 described above mainly in that it comprises a different kind of actuators that do not need to be supported on a fixed and rigid counter member, such as the holding ring 70 of the previous embodiments. More specifically, the manipulator M3 comprises eight actuator layers 3711 to 3718 that solely rest on the lower optical surface 372 of the second plane-parallel plate 352. As can best be seen in FIG. 7, the actuator layers 3711 to 3718 have, in the embodiment shown, the shape of ring segments that are arranged close to the circumference of the second plate 352 such that they form a ring interrupted by slit-like gaps. However, the segments of actuator layers 3711 to 3718 may also be configured such that they abut to adjacent elements which results in a quasi-continuous actuator ring.

Each actuator layer 3711 to 3718 is formed in this embodiment by a piezo electric element. The crystals of the piezo electric elements may be fixed to the lower surface 372 of the second plate 352 using additional connector layers, glues, bonding, fusion bonding, solding or optical contacting. Since the actuator layers 3711 to 3718 are arranged immediately adjacent the second frame 58, electrical conductors for supplying an electrical voltage to the piezo electric elements can be attached or received within the second frame 58.

The crystals of the piezo electric elements are aligned such that, upon application of an electrical voltage, tensile or compressive forces are produced by the actuator layers 3711 to 3718 along a tangential direction indicated by double arrows in FIG. 7. The directions of the forces therefore extend in a plane which is perpendicular to the optical axis OA. This is different to the actuators 711 to 718 of the previous embodiments where forces parallel to the optical axis OA are produced.

Since the actuator layers 3711 to 3718 are arranged only on one side of the second plate 352, there will be an asymmetric force distribution within the second plate 352 which causes its bending. This even holds true if the forces produced by the actuator layers 3711 to 3718 are substantially rotationally symmetric. The more actuator layers being individually controllable are arranged around the circumference of the second plate 352, the more different deformations may be produced by the actuator layers. It is to be understood that the actuator layers 3711 to 3718 do not have to have the same geometry, but may be adapted to specific desired deformations that are required for correcting certain image errors.

Apart from not requiring the holding ring 70 or a similar counter member, the actuator layers 3711 to 3718 are flatter and therefore require less room within the projection objective 20.

In an alternative embodiment, the actuator layers 3711 to 3718 are not formed by piezo electric elements, but by layers having a coefficient of thermal expansion which is different from the second plate 352. If such layers are heated, for example by applying an electrical voltage or by illumination with a laser beam, the change of length of such layers results again in compressive or tensile forces on the second plate 352 in a plane perpendicular to the optical axis OA. Therefore the second plate 352 will deform as a result of the different coefficients of thermal expansion.

If the manipulator M3 is part of a closed feedback control loop, the second plate 352 may be deformed as long as it is necessary to reduce the image errors below a tolerable threshold. However, the correction process may be accelerated if information is obtained how the second plate 352 has been actually deformed by the actuator layers 3711 to 3718. To this end sensors 380 may be arranged on the upper optical surface 364 of the second plate 352 around its circumference in a similar way as the actuator layers 3711 to 3718 are arranged on the lower optical surface 372. The sensors 380 make it possible to measure the deformation produced by the actuator layers 3711 to 3718. The measured thickness data produced by the sensors 380 are preferably supplied to the controller 36 so that the actuator layers 3711 to 3718 may be adjusted to reduce any differences between the measured deformations and the calculated target deformation required for correcting the image errors.

The sensors 380 may also be formed by piezo electric elements. These elements produce a voltage if they are subjected to compressive or tensile forces. Other kinds of sensors 380 are contemplated as well, for example resistant strain gauges that change their electrical resistance depending on the strain across the gauges.

As a matter of course, the positions of the actuator layers 3711 to 3718 and the sensors 380 may be reversed, i.e. the actuator layers 3711 to 3718 may be applied to the upper optical surface 364, and the sensors may be formed on the lower optical surface 372. The choice on which side these elements are applied may depend on the compatibility of the elements with the liquid 62.

In a still further alternative embodiment, actuator layers are applied on both the upper optical surface 364 and the lower optical surface 372. Such a configuration is expedient if larger deformations of the second plate 352 have to be available. For correcting stronger wavefront deformations, as they are caused by asymmetric lens heating, for example, the required deformations of the second plate 352 may be as large as about 500 nm.

Figure 8:
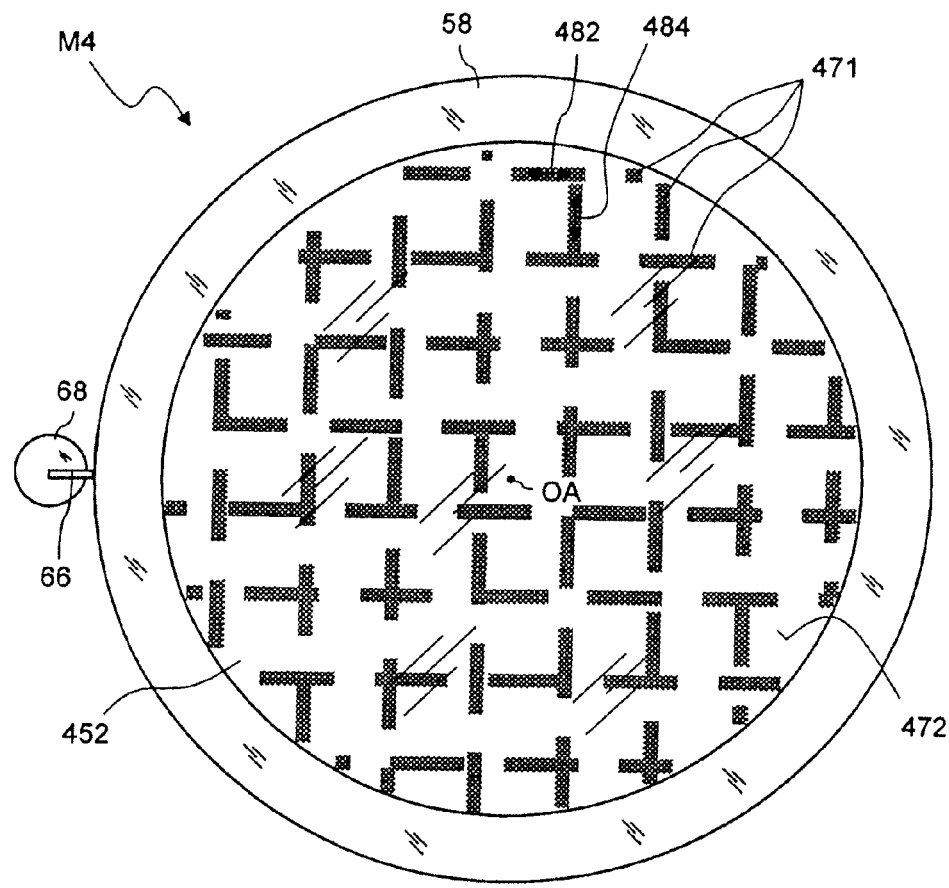
FIG. 8 is a view from below of a manipulator according to another embodiment comprising actuator layers distributed over the entire optical surface.

FIG. 8 is a view from below of a manipulator M4 according to a further embodiment of the invention. For like parts the same reference numerals as in FIGS. 2 to 4 are used, and for parts corresponding to one another use is made of reference numerals augmented by 400. The manipulator M4 is equally suitable for being positioned within the projection objective 20 close to the pupil plane 32 or also at other positions along the optical axis OA. The manipulator M4 differs from the manipulator M3 shown in FIGS. 6 and 7 in that a large plurality of actuator layers 471 are distributed over the entire lower surface 472 of the second plate 452.

If the actuator layers 471 are not or only partially transparent at the wavelength of the projection light, the manipulator M4 has to be arranged in or in close proximity to a pupil plane of the projection objective 20. The projection light absorbed by the actuator layers 471 will then cause a reduction of the light intensity in the image plane 28 of the projection lens 20, but does not produce image errors, as would be the case with an arrangement further away from a pupil plane. In order to keep the light losses small, the overall area of the actuator layers 471 should not exceed 30%, preferably 10%, of the area of the plate 52 through which projection light may propagate.

Light losses may be (at least substantially) avoided if the actuator layers 471 and the necessary electrical wiring (not shown in FIG. 8) are transparent at the wavelength of the projection light. In this case it may even be envisaged to arrange the manipulator M4 outside a pupil plane of the projection projective 20. Transparent actuator layers 471 may be formed by crystalline quartz elements that display a piezo electric effect. Electrical wiring for the piezo electric elements may be made of indium tin oxide (ITO) which is transparent at wavelengths below 200 nm. If the electrical wiring is formed by very thin conductive stripes, also non-transparent conductive materials such as aluminum may be used without substantially increasing light losses due to absorption by the electrical wiring.

Since the actuator layers 471 are distributed over the entire lower optical surface 472 of the second plate 452, it is possible to produce almost any arbitrary deformation of the second plate 452. The more actuator layers 471 are provided, the larger is the variety of deformations that may be produced. The manipulator M4 therefore makes it possible to correct also very complicated wavefront deformations that can be adequately described only with higher order Zernike polynomials.

In the embodiment shown in FIG. 8 the actuator layers 471 commonly form a Cartesian grid so that compressive and/or tensile forces may be applied to the second plate 52 in two orthogonal directions, as is indicated in FIG. 8 by double arrows 482, 484. As a matter of course, other configurations of the actuator layers 471 may be chosen depending on the expected image errors and the deformations of the second plate 52 required for correcting those errors. For example, the actuator layers 471 may be formed as stripes that radially extend from the optical axis OA to the rim of the second plate 452. This configuration may have an m-fold symmetry adapted to the symmetry of the wavefront deformations that shall be corrected by the deformation of the second plate 452. Another alternative for a suitable configuration is to arrange stripes of actuator layers so that a honeycombed pattern is obtained.

It should be noted that, although the embodiments described hereinabove all contain a liquid adjacent to a deformable optical surface, the principle of applying thin actuator layers to a deformable optical surface may be seen in a broader sense. Therefore thin actuator layers may be applied also on those refractive or reflective optical surfaces that are not in contact with a liquid.

Figure 9:
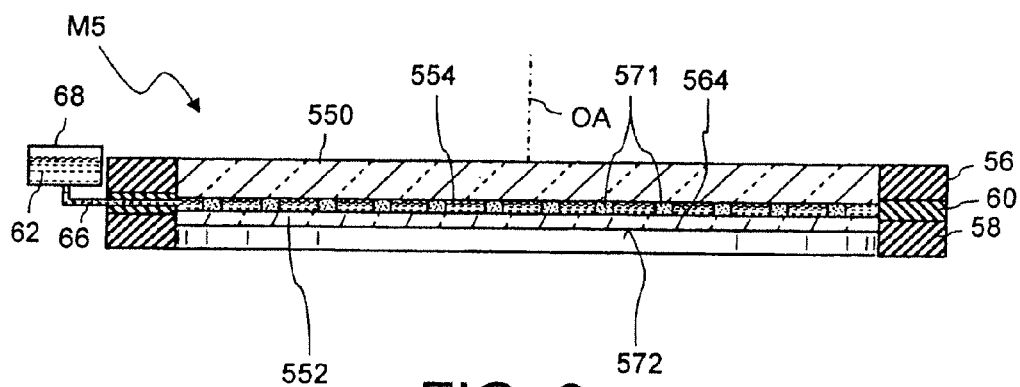
FIG. 9 is a meridional section through a manipulator according to another embodiment wherein actuators are immersed in a liquid.

FIG. 9 shows a manipulator M5 according to still another embodiment in a meridional section similar to FIG. 2. For like parts the same reference numerals as in FIGS. 2 to 4 are used, and for parts corresponding to one another use is made of reference numerals augmented by 500. The manipulator M5 is equally suitable for being positioned within the projection objective 20 close to the pupil plane 32 or also at other positions along the optical axis OA.

The manipulator M5 differs from the manipulator M1 shown in FIGS. 2 to 4 mainly in that actuators 571 are not arranged on the lower optical surface 572 of the second plate 552, but on its upper optical surface 564. The actuators 571 are therefore arranged within the interspace 554 and completely immersed in the liquid 62. Furthermore, the actuators 571 are not arranged around the circumference of the second plate 52, but distributed over its entire upper optical surface 564. Similar to the manipulator M4 shown in FIG. 8, this implies that the manipulator M5 should be, due to absorption caused by the actuators 571, arranged in or in close proximity to a pupil plane of the projection objective 20. Apart from that the actuators. 571 should be either transparent at the wavelength of the projection light, or the overall area covered by the actuators 571 should be kept small in order to reduce light losses and to avoid problems caused by heat resulting from light absorption.

The actuators 571 may be arranged in a grid-like fashion on the upper optical surface 564 of the second plate 552 so that almost any arbitrary deformation of the second plate 552 is achievable. The electrical wiring (not shown) required for individually controlling the actuators 571 is preferably applied to the lower surface of the rigid first plate 550 which does not significantly deform if the actuators 571 are operated. This reduces the risk of damages of the electrical wiring caused by deformations.

The actuators 571 may be realized as piezo electric elements, for example made of crystalline quartz. The piezo electric elements are oriented such that their length along the optical axis OA varies in response to the applied voltage. Alternatively, elements may be used that change their length along this direction depending on their temperature. The temperature may be varied by an electrical current flowing through these elements, or by an external laser, for example.

Figure 10:
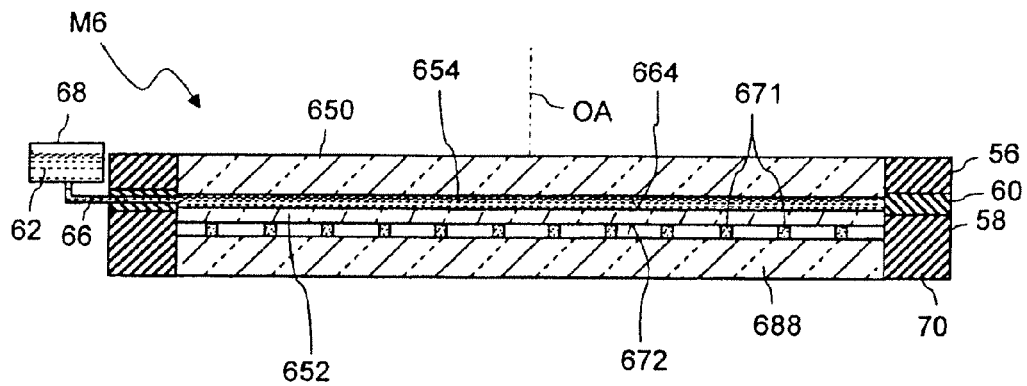
FIG. 10 is a meridional section along line X-X through a manipulator according to still another embodiment comprising actuators that are distributed over the entire optical surface, but outside an interspace filled with liquid.
Figure 11:
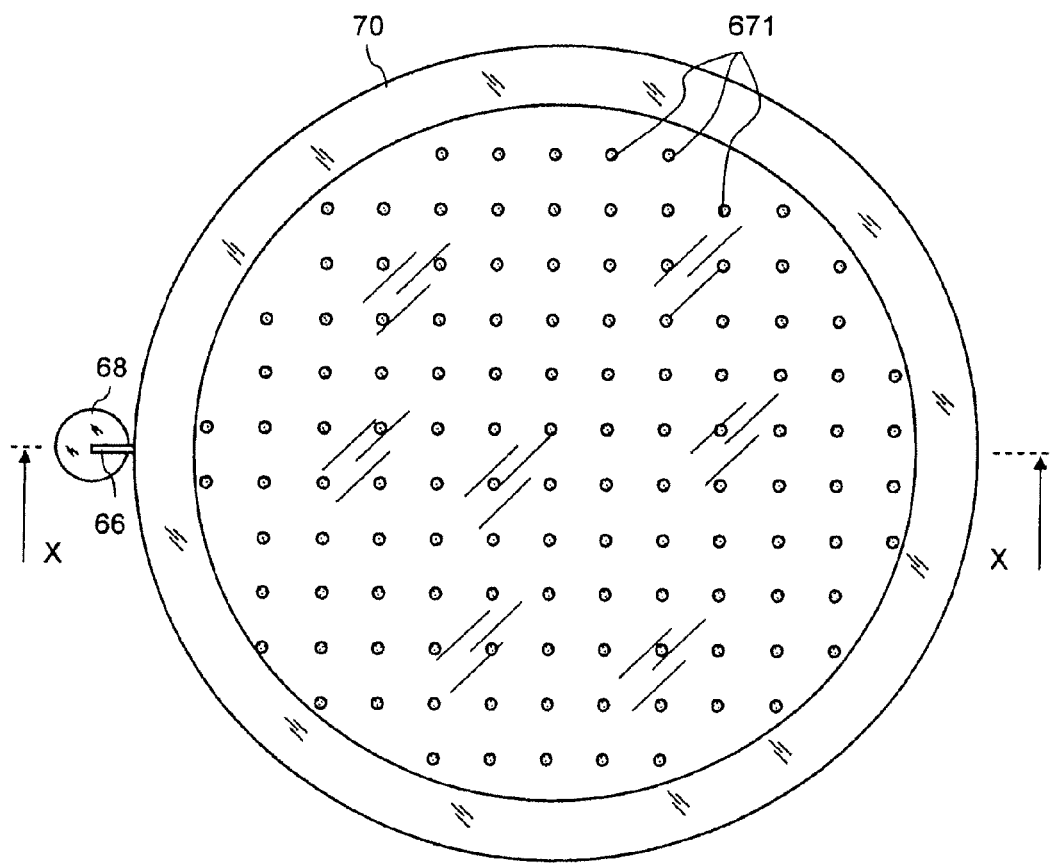
FIG. 11 is a view from below of the manipulator shown in FIG. 10.

FIGS. 10 and 11 show a manipulator M6 according to still another embodiment in a meridional section across line X-X and in a view from below, respectively. For like parts the same reference numerals as in FIGS. 2 to 4 are used, and for parts corresponding to one another use is made of reference numerals augmented by 600. The manipulator M6 is equally suitable for being positioned within the projection objective 20 close to the pupil plane 32 or also at other positions along the optical axis OA.

The manipulator M6 mainly differs from the manipulator M5 shown in FIG. 9 in that the actuators 671 are not distributed within the interspace 654 which is filled with the liquid 62. Instead, the actuators 671 are distributed over the lower optical surface 672 of the second plate 652. In this embodiment the actuators 671 are assumed to change their length along the optical axis OA and therefore have to rest on a rigid counter member. This counter member is realized as a third transparent plane-parallel plate 688 received in the holding ring 70 adjacent the second plate 652. The third plate 688 has a thickness such that it is not, or at least not significantly, deformable by the actuators 671. If the operation of the actuators 671 results in a change of their length along the optical axis OA, this will therefore only result in a deformation of the second plate 652, but not of the third plate 688. If layer actuators are used as in the embodiments shown in FIGS. 6 to 8, the third plate 688 may be dispensed with.

The arrangement of the actuators 671 outside the liquid 62 is advantageous for various reasons. Firstly, the actuators 671 are not immersed in a liquid, but surrounded by a gas, for example an inert gas such as nitrogen. Therefore no care has to be taken in the selection of the liquid 62 and the actuators 671 whether the liquid 62 may be contaminated by the actuators 671, and/or whether the liquid 62 may damage the actuators 671. Apart from that, any problems resulting from the contact of the electrical wiring (not shown) with a liquid are completely avoided. Furthermore, the fastening of the actuators 671 to the adjacent plates is greatly facilitated because many fastening technologies are susceptible to damages caused by surrounding liquids. For that reason the actuators 671 may be fastened to the second plate 652 and the third plate 688 by optical bonding, which is generally difficult or even impossible in the case of the manipulator M5 shown in FIG. 9. Another advantage is that the thin deformable second plate 652 is now sandwiched between two thicker and more rigid plates that protect the deformable second plate 652 from damages during assembly and maintenance work.

The following aspects may be considered when designing the manipulator M6:

The deformable second plate 652 should be as thin as possible so as to reduce the forces, and therefore the number and size of the actuators 671, which are required for causing a deformation thereof. On the other hand the first plate 650 and the third plate 688 should be as rigid as possible. The number of actuators 671 should be as small as possible in order to minimize the overall actuator area and thus the light losses in the pupil plane. The actuators 671 should furthermore have a low power consumption and should not display a significant drift behavior in spite of their small size. Apart from piezo electric elements that have been mentioned above, Lorenz actuators or thermo-elastic actuators often fulfill these criteria. The actuators 671 may be produced on the third plate 688 using CVD/PVD methods, sputtering or etch processes. Similar considerations also apply to the other embodiments shown in FIGS. 6 to 9.

In the foregoing it has been assumed that the first plate 650, the second plate 652 and the third plate 688 are received in annular frames in a sealed fashion. However, other methods for mounting these plates may be used instead, for example isostatic mounting or mounts with resilient legs, as are known in the art as such. A sealed enclosure of the interspace 654 filled with a liquid 62 may be achieved by bellows, similar to what is shown below in FIG. 16.

The exemplary arrangement of the actuators 671 as shown in FIG. 11 may be varied in various ways. Instead of arranging the actuators 671 as a regular grid, configurations may be considered which are specifically adapted to the expected wavefront deformations requiring correction.

Figure 12:
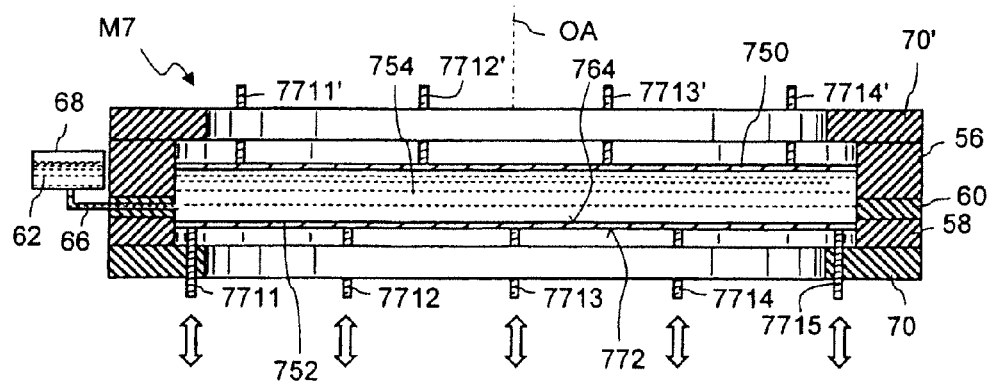
FIG. 12 is a meridional section along line XII-XII through a manipulator according to another embodiment comprising two deformable optical elements.
Figure 13:
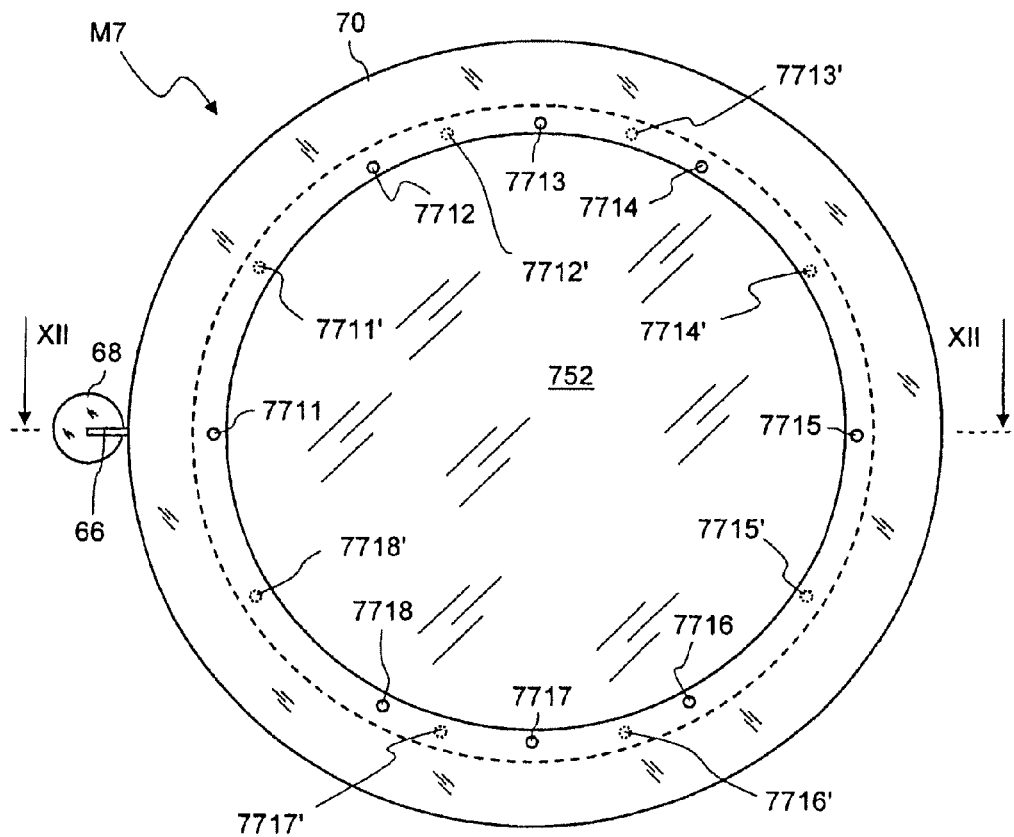
FIG. 13 is a view from below of the manipulator shown in FIG. 12.

FIGS. 12 and 13 show a manipulator M7 according to another embodiment in a meridional cross section along line XII-XII and a view from below. For like parts the same reference numerals as in FIGS. 2 to 4 are used, and for parts corresponding to one another use is made of reference numerals augmented by 700. The manipulator M7 is equally suitable for being positioned within the projection objective 20 close to the pupil plane 32 or also at other positions along the optical axis OA.

The manipulator M7 mainly differs from the manipulator M1 shown in FIGS. 2 to 4 in that the first thick plate 50 is replaced by a thin first plate 750 which is deformable upon operation of a plurality of actuators first 7711' to 7718'. The first actuators 7711' to 7718' are received in a second holding ring 70' which is connected to the first frame 56. The manipulator M7 therefore has two optical surfaces that can be individually deformed. Since these deformations are caused independently by first actuators 7711' to 7718' and second actuators 7711 to 7718 and not (only) by pressure changes of the liquid 62, a wide variety of deformations can be produced.

Figure 14:
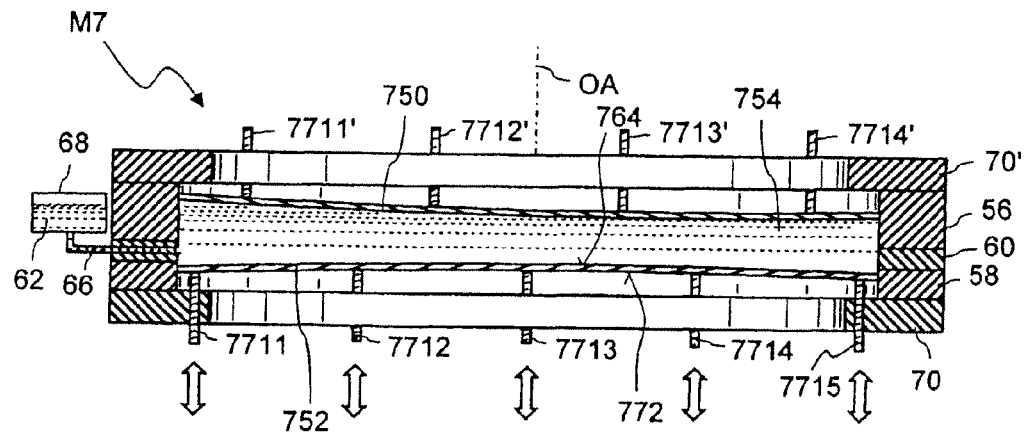
FIG. 14 shows the manipulator of FIGS. 12 and 13 with deformed optical surfaces.

FIG. 14 shows the manipulator M7 in a configuration in which the first and second deformable plates 750, 752, respectively, are individually deformed. Here it is assumed that the second actuators 7711 to 7718 are controlled in such a way that the second plate 752 has, in its deformed configuration, a two-fold rotational symmetry, as it typically occurs with illumination fields having an elongated slit-like shape. The first plate 750 is assumed to have, in its deformed configuration, a shape with a three-fold rotational symmetry. In this respect it is noted that the second actuators 7111 to 7118 for the second plate 752 are not arranged around the circumference of the second plate 752 in the same way as the first actuators 7111' to 7118' acting on the first plate 750. Thus the first plate 750 may be deformed in a manner that cannot be achieved with the second plate 752, and vice versa.

Figure 15:
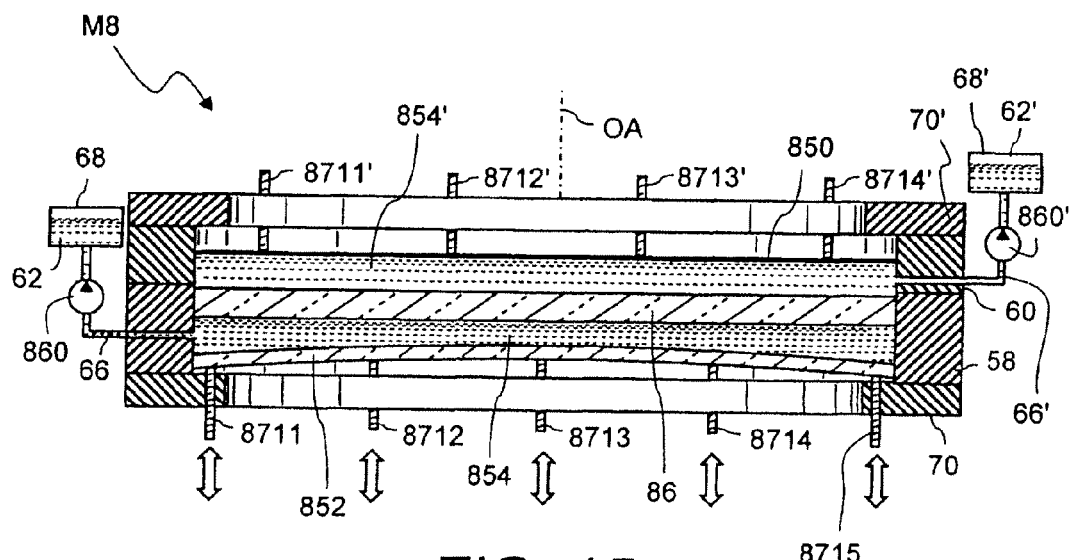
FIG. 15 is a meridional section through a manipulator according to another embodiment in which deformations are also caused by pressure variations.

FIG. 15 shows a manipulator M8 according to a still further embodiment in a meridional section. For like parts the same reference numerals as in FIGS. 2 to 4 are used, and for parts corresponding to one another use is made of reference numerals augmented by 800. The manipulator M8 is equally suitable for being positioned within the projection objective 20 close to the pupil plane 32 or at other positions along the optical axis OA.

The manipulator M8 differs from the manipulator M7 shown in FIGS. 12 to 14 mainly in that the interspace 54 is divided into a first interspace 854' and a second interspace 854 by a rigid plane-parallel plate 86. The deformable members adjacent the first and second interspaces 854', 584 are formed in this embodiment by a pellicle 850 and a thin meniscus lens 852. In the meridional section of FIG. 15 first actuators 8711' to 8714' can be seen that are received in a first holding ring 70' for deforming the pellicle 850. Second actuators 8711 to 8715 can be seen that are received in a second holding ring 70 for deforming the meniscus lens 852.

The rigid plate 86 reliably ensures that deformations of the meniscus lens 852 do not cause, via pressure fluctuations in the liquid, deformations of the pellicle 850, and vice versa.

The provision of two completely decoupled interspaces 854, 854' filled with liquids 62, 62' makes it furthermore possible to deform the pellicle 850 and the meniscus lens 852 independently from each other by varying the pressure of the liquids 62, 62'. To this end the manipulator M8 comprises two pumps 860, 860' that are connected to reservoirs 68, 68' containing the liquids 62 and 62', respectively, and to channels 66, 66' leading into the interspaces 854, 854'. By appropriately controlling the pumps 860, 860' it is possible to independently vary the pressure of the liquids 62, 62' in the interspaces 854, 854'.

The pressure controlled by the pumps 860, 860' therefore provides an additional parameter that may be used, in addition to the first and second actuators 8711' to 8714' and 8711 to 8715, for giving the pellicle 850 and the meniscus lens 852 the shape that is required for correcting image errors. The deformation caused by the pressure variation superimposes with the deformation caused by the first and second actuators 8711' to 8714' and 8711 to 8715, respectively. The provision of the separated interspaces 854, 854' and the pumps 860, 860' therefore makes it possible to still further increase the range of deformations that may be achieved with the manipulator M8.

As a matter of course, instead of the pumps 860, 860' various other means may be provided for changing the pressure of the liquids 62, 62'. For example, hydraulic cylinders or deformable membranes may be used.

The deformations that can be achieved with pressure fluctuations depend mainly on the material properties and the shape of the deformable member, and on the way it is mounted to non-deformable members of the projection objective 20.

Important design parameters for the shape of the deformable member are its outer contour and its thickness distribution. For example, if a plane-parallel plate has a rectangular contour, a pressure increase will result in a deformation of the plate having a two-fold symmetry.

The deformable members of the manipulator M8, namely the pellicle 850 and the meniscus lens 852, are assumed to have circular contours. Nevertheless both members 850, 852 will respond differently to pressure variations, because both members 850, 852 have different thickness distributions. Since both the pellicle 850 and the meniscus lens 852 are completely rotationally symmetric, pressure variations within the liquid 62, 62' will necessarily cause deformations which are equally rotationally symmetric.

If a deformable optical element has a thickness distribution which is rotationally asymmetric, then a pressure variation will also cause a rotationally asymmetric deformation even if the outer contour of the element is circular.

Figure 16:
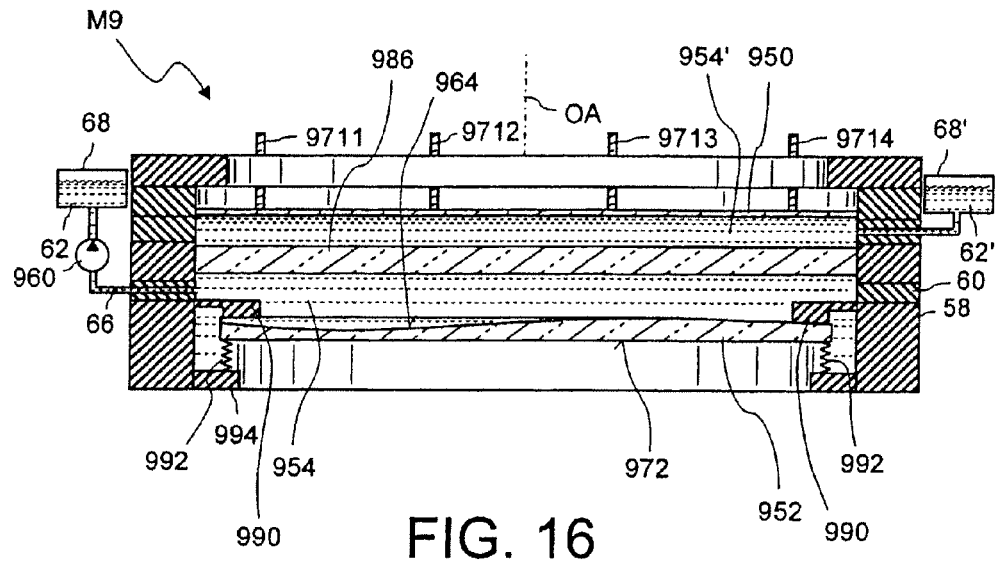
FIG. 16 is a meridional section through a manipulator according to still another embodiment comprising a deformable member having a rotationally asymmetric shape.

This concept is realized in the manipulator M9 which is shown in FIG. 16 in a meridional section. For like parts the same reference numerals as in FIGS. 2 to 4 are used, and for parts corresponding to one another use is made of reference numerals augmented by 900. The manipulator M9 is equally suitable for being positioned within the projection objective 20 close to the pupil plane 32 or also at other positions along the optical axis OA.

The manipulator M9 differs from the manipulator M8 shown in FIG. 15 mainly in that the meniscus lens 852 is replaced by a lens 952 that has a rotationally symmetric contour, but—even in its undeformed state, i.e. in the absence of any forces other than the force of gravity—a rotationally asymmetric thickness distribution.

When the lens 952 is deformed by using actuators or, in this particular embodiment, solely by changing the pressure of the liquid 62 with the help of the pump 960, the deformation will be rotationally asymmetric due to the rotationally asymmetric shape of the undeformed lens 952. This rotationally asymmetric shape of the undeformed lens 952 is, in this particular embodiment, designed such that it corrects coma aberration after being deformed.

Preferably the lens 952 has a rotationally symmetric optical effect in its undeformed state. This may be achieved by providing the lens 952 with an upper surface 964 which is rotationally asymmetric, whereas the lower surface 972 of the lens 952 is rotationally symmetric, for example plane and perpendicular to the optical axis OA, as is the case here. If the liquid 62 filling the second interspace 954 has (almost) the same index of refraction as the lens 952, the upper rotationally asymmetric surface 964 has no or at least no substantial optical effect. Only the lower surface 972 adjacent to a gas (or alternatively to a liquid having a significantly distinct index of refraction) contributes to the overall optical effect of the lens 952. In this embodiment this is the effect of a plane-parallel plate. In embodiments with a convexly or concavely curved lower surface 972, the lens 952 has, in its undeformed state, a rotationally symmetric refractive power like a commonplace lens.

In the embodiment shown the lens 952 is mounted with the help of two or more mounting legs 990. For sealing the second interspace 954 against the outside, a metal bellow 992 is sealingly connected to the lens 952 and a holding ring 994. The metal bellows 992 allow for small movements of the lens 952 resulting from pressure variations produced by the pump 960.

A first interspace 954' is formed between a rigid plane-parallel plate 986 and a thin deformable plane-parallel plate 950. In this embodiment the plate 950 can only be deformed by actuators of which four actuators 9711 to 9714 can be seen in the meridional section of FIG. 16.

If the plate 950 is replaced by another lens that is obtained by rotating the lens 952 by 90° around the optical axis OA, coma aberrations of any arbitrary direction can be corrected by changing the pressure of the adjacent liquids or with the help of actuators.

Figure 17:
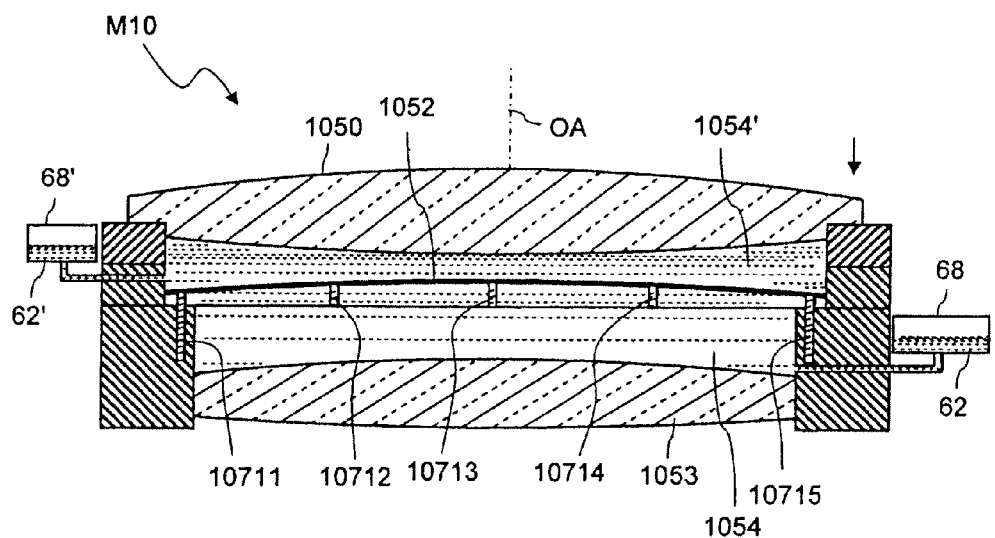
FIG. 17 is a meridional section through a manipulator according to still another embodiment comprising a flexible membrane separating two fluids from each other.

FIG. 17 shows a manipulator M10 according to still another embodiment in a meridional section. For like parts the same reference numerals as in FIGS. 2 to 4 are used, and for parts corresponding to one another use is made of reference numerals augmented by 1000. The manipulator M10 is equally suitable for being positioned within the projection objective 20 close to the pupil plane 32 or also at other positions along the optical axis OA.

The main difference between the manipulator M10 on the one hand and the manipulators according to the previous embodiments is that the deformable member, which is realized in this embodiment by a thin membrane 1052, does not separate a liquid and a gaseous medium, but two liquid mediums having different refractive indices. Again, there is only one refractive surface that can be deformed using actuators from which actuators 10711 to 10715 can be seen in the meridional section of FIG. 17. However, since the refractive index ratio of two liquids is generally quite closer to 1 than the ratio obtained with a liquid and a gas, deformations of the membrane 1052 will have a much weaker optical effect than deformations of the deformable members that have been described previously. The manipulator M10 is therefore particularly suitable for carefully correcting small image errors with high accuracy.

In the embodiment shown a first interspace 1054' is formed between a first thick and rigid biconvex lens 1050 and the membrane 1052. The first interspace 1054' is filled with a first liquid 62'. A second interspace 1054 is formed between the membrane 1052 and a second rigid biconvex lens 1053 and is filled with a second liquid 62. Since the sensibility of the manipulator M10 depends on the refractive index ratio between the first liquid 62' and the second liquid 62, it is easily possible—even after the manipulator M10 has been mounted in the projection objective 20—to change this sensitivity by replacing one or both liquids with a liquid having a different index of refraction. Alternatively, the index of refraction, and therefore the sensitivity of the manipulator M10, may be varied by changing the temperature of one or both liquids 62, 62'. This exploits the fact that the refractive index of liquids usually displaces a strong temperature dependency.

In contrast to prior art solutions where the deformable member is deformed solely as a result of pressure variations within the liquids, the manipulator M10 makes it possible to produce a variety of completely different deformations with the help of the actuators 10711 to 10715. For example, a deformation having a 3-fold symmetry may be produced first, and after some ours of operation an additional deformation having a 2-fold symmetry may be superimposed under appropriate arrangement and control of the actuators 10711 to 10715. The manipulator M10 is therefore suitable not only for correcting field curvature aberration, but also field independent image errors that can only be described with higher order Zernike polynomials.

As a matter of course, the provision of actuators does not exclude the additional provision of pressure changing means, as has been described above with reference to the manipulator M8 shown in FIG. 15.

If the membrane 1052 is sufficiently thin, it may have a refractive index that is distinct from both refractive indices of the adjacent liquids 62, 62'. Also in this embodiment the use of other deformable optical members, for example thin plates or meniscus lenses, is contemplated as well.

As matter of course, also in the previously described embodiments it is envisaged to circulate intermittently or continuously the liquids within their respective interspaces.

Figure 18:
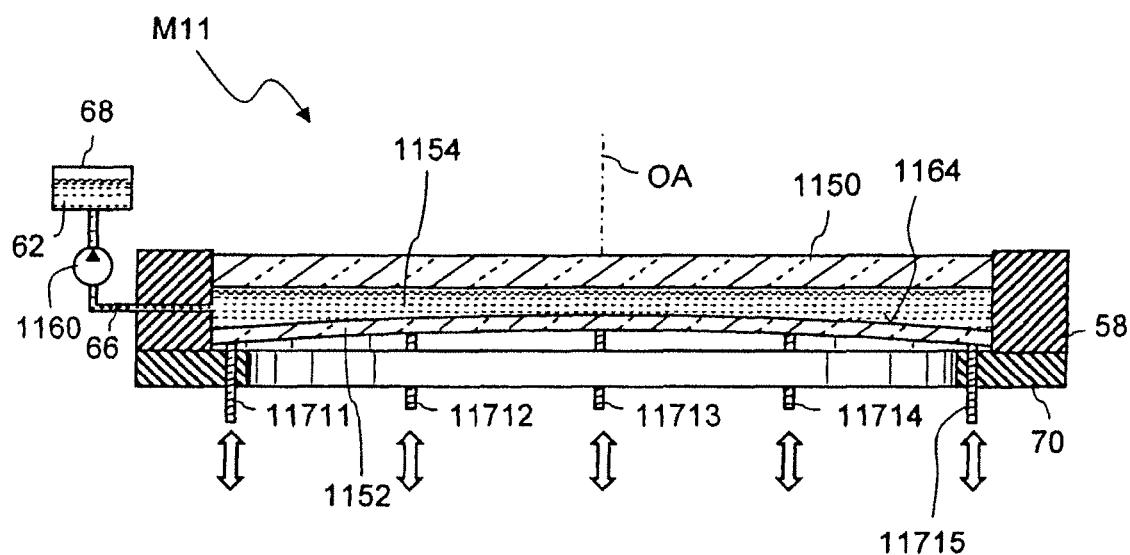
FIG. 18 is a meridional section through a manipulator according to a still further embodiment comprising a member which is deformable both by pressure variations and actuators.

FIG. 18 shows a manipulator M11 according to a still further embodiment in a meridional section. For like parts the same reference numerals as in FIGS. 2 to 4 are used, and for parts corresponding to one another use is made of reference numerals augmented by 1100. The manipulator M11 is equally suitable for being positioned within the projection objective 20 close to the pupil plane 32 or also at other positions along the optical axis OA.

The manipulator M11 differs from the manipulator M8 shown in FIG. 15 in that it has only one deformable optical member, namely the thin meniscus lens 1152. The meniscus lens 1152 has an upper surface 1164 which has a (weak) 2-fold rotational symmetry (not shown in FIG. 18), similar to the lens 952 of the manipulator M9 shown in FIG. 16. Actuators 11711 to 11715 are arranged around the circumference of the lens 112 such that a deformation having a 3-fold symmetry may be achieved.

By independently controlling the pressure of the liquid 62 using the pump 1160 (similar pressure variation means) on the one hand and the actuators 11711 to 11715 on the other hand, deformations with 2-fold and 3-fold symmetries may be successively or simultaneously be produced. Since it often suffices to be able to individually produce two deformations having different symmetries, an additional deformable member, for example the membrane 850 of the manipulator M8 shown in FIG. 15, may be dispensed with.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An apparatus, comprising:
a first optical element that is refractive;
a second element;
a liquid between the first optical element and the second element; and
an actuator coupled to the first optical element such that operation of the actuator causes a rotationally asymmetric deformation of the first optical element substantially without causing a deformation of the second element,
wherein the apparatus is a microlithographic projection exposure apparatus.

2. An apparatus according to claim 1, wherein the first optical element is a plane-parallel plate.

3. An apparatus according to claim 1, wherein the first optical element is a meniscus lens.

4. An apparatus according to claim 1, wherein the first optical element is a membrane.

5. An apparatus according to claim 1, wherein:
there is an interspace between the first optical element and the second element and, the interspace has, in a direction along an optical axis of a projection objective of the apparatus, a maximum thickness of less than 1 mm.

6. An apparatus according to claim 5, wherein the maximum thickness is less than 2 μm.

7. An apparatus according to claim 1, wherein the deformation of the first optical element has an m-fold symmetry or a superposition of a plurality of m-fold symmetries with m being an even, positive integer.

8. An apparatus according to claim 1, comprising at least two actuators that are configured to exert bending moments on the first optical element.

9. An apparatus according to claim 8, wherein the at least two actuators are arranged along a circumference of the first optical element.

10. An apparatus according to claim 8, wherein the actuators are configured such that at least two deformations of the first optical element can be generated having a different m-fold symmetry.

11. An apparatus according to claim 1, wherein the second element is reflective.

12. An apparatus according to claim 1, wherein the second element is refractive.

13. An apparatus according to claim 12, wherein the second element is a meniscus lens or a plane-parallel plate.

14. An apparatus according to claim 1, comprising a second actuator configured to act exclusively on the second element to generate a deformation of the second element.

15. An apparatus according to claim 14, wherein the deformation of the second element is rotationally asymmetric.

16. An apparatus according to claim 14, wherein the deformation of the second element is rotationally symmetric.

17. An apparatus according to claim 1, comprising a pressure equalizer configured to maintain a constant pressure of the liquid in an immersion space.

18. An apparatus according to claim 1, wherein the first optical element is arranged in or in close proximity of a pupil plane.

19. An apparatus according to claim 1, wherein the actuator is fastened to a front or a rear surface of the first optical element, and wherein the actuator is configured to produce on the first optical element compressive and/or tensile forces along directions that are at least substantially tangential to the surface.

20. An apparatus according to claim 19, wherein the actuator is formed by a layer which is applied to the surface, the layer having a variable dimension along at least one direction.

21. An apparatus according to claim 20, wherein the layer comprises a piezo electric material.

22. An apparatus according to claim 20, wherein the layer comprises a material having a coefficient of thermal expansion that is different from the coefficient of thermal expansion of the first optical element.

23. An apparatus according to claim 22, comprising a device configured to controllably change the temperature of the layer.

24. An apparatus according of claim 23, wherein the device is configured to direct radiation onto the layer.

25. An apparatus according of claim 23, wherein the device is configured to apply a voltage to the layer.

26. An apparatus according to claim 20, wherein a plurality of layers have the shape of ring segments, the ring segments forming a circular ring which is centered with respect to an optical axis of a projection objective of the apparatus.

27. An apparatus according to claim 26, wherein the ring segments are spaced apart by gaps.

28. An apparatus according claim 19, wherein a plurality of actuators are distributed over the surface within an area through which projection light propagates.

29. An apparatus according to claim 28, wherein the plurality of actuators are at least substantially transparent at the wavelengths of the projection light.

30. An apparatus according to claim 28, wherein the plurality of actuators are opaque at the wavelengths of the projection light, and wherein the manipulator is arranged in or in close proximity to a pupil plane of a projection objective of the apparatus.

31. An apparatus according to claim 1, comprising a sensor that is fastened to a front or rear surface of the first optical element, wherein the sensor is configured to measure a deformation of the first optical element produced by the actuator.

32. An apparatus according to claim 31, wherein the sensor is configured to produce an output signal which depends on the amount of compressive and/or tensile forces produced in the sensor by a deformation of the first optical element.

33. An apparatus according to claim 1, wherein a plurality of actuators are distributed over an area, through which projection light is allowed to propagate, of a surface of the first optical element which is opposite to a surface which is in contact with the liquid.

34. An apparatus according to claim 33, comprising a further optical element that is refractive on which the plurality of actuators rest.

35. An apparatus according to claim 1, further comprising:
a third optical element; and
means for deforming the third optical element,
wherein there is an interspace between the second element and a third optical element, both the second element and the third optical element are refractive.

36. An apparatus according to claim 1, comprising a device configured to change the pressure of the liquid.

37. An apparatus according to claim 1, wherein the first optical element has a shape in its undeformed state which is rotationally asymmetric.

38. An apparatus according to claim 37, wherein the first optical element has a thickness distribution in its undeformed state which is rotationally asymmetric.

39. An apparatus according to claim 38, wherein the first optical element has a first surface, which is in contact to the liquid and has a rotationally asymmetric shape, and a second surface opposite the first surface, wherein the second surface has a rotationally symmetric shape.

40. An apparatus according to claim 1, further comprising:
a controller configured to drive the actuator; and
a sensor arrangement connected to the controller, the sensor arrangement being configured to determine the image errors.

41. The apparatus of claim 40, wherein the sensor arrangement comprises a CCD sensor, which is positionable in an image plane of a projection objective of the apparatus or in a field plane conjugate therewith.

42. The apparatus of claim 41, wherein the actuator, the controller and the sensor arrangement form a closed feedback loop.

43. A method, comprising:
providing an apparatus according to claim 1, the apparatus comprising an illumination system and a projection objective;
arranging a mask in an object plane of the projection objective of the apparatus;
using the illumination system to illuminate the mask with light; and
after illuminating the mask with light, using the projection objective to project the mask onto a photosensitive layer which is arranged in an image plane of the projection objective.

44. An apparatus, comprising:
a first optical element that is refractive, the first optical element having a thickness distribution in its undeformed state which is rotationally asymmetric,
a second element,
a fluid between the first optical element and the second element; and
means for deforming the first optical element,
wherein the apparatus is a microlithographic projection exposure apparatus.

45. A method, comprising:
providing an apparatus according to claim 44, the apparatus comprising an illumination system and a projection objective;
arranging a mask in an object plane of the projection objective of the apparatus;
using the illumination system to illuminate the mask with light; and
after illuminating the mask with light, using the projection objective to project the mask onto a photosensitive layer which is arranged in an image plane of the projection objective.

46. An apparatus, comprising:
a first optical element that is refractive;
a second element;
a liquid between the first optical element and the second element; and
an actuator coupled to the first optical element such that operation of the actuator causes a rotationally asymmetric deformation of the first optical element substantially without causing a deformation of the second element,
wherein a ratio between the refractive index of the first optical element and the refractive index of the liquid is between 0.9 and 1.1, and the apparatus is a microlithographic projection exposure apparatus.

47. An apparatus according to claim 46, wherein the ratio between the refractive index of the first optical element and the refractive index of the liquid is between 0.99 and 1.01.

* * * * *

UNITED STATES PATENT AND TRADEMARK OFFICE
CERTIFICATE OF CORRECTION

| | | |
|---|---|---|
| PATENT NO. | : 7,990,622 B2 | Page 1 of 1 |
| APPLICATION NO. | : 12/896128 | |
| DATED | : August 2, 2011 | |
| INVENTOR(S) | : Olaf Conradi et al. | |

It is certified that error appears in the above-identified patent and that said Letters Patent is hereby corrected as shown below:

Page 2, column 2, line 16, delete "3/2005" insert --5/2006--.

IN THE SPECIFICATIONS:

Column 1, line 45, after "for" delete "a".

Column 4, line 16, after "element" insert --.--.

Column 5, line 40, delete "manipulafor" insert --manipulator--.

Column 14, line 31, delete "solding" insert --soldering--.

Column 14, line 54, after "not" delete "have to".

Column 21, line 44, delete "ours" insert --hours--.

IN THE CLAIMS:

Column 23, line 43, Claim 24, delete "of" insert --to--.

Column 23, line 45, Claim 25, delete "of" insert --to--.

Column 23, line 53, Claim 28, after "according" insert --to--.

Signed and Sealed this
Twenty-second Day of November, 2011

David J. Kappos
*Director of the United States Patent and Trademark Office*